(12) United States Patent
Song et al.

(10) Patent No.: US 11,355,059 B2
(45) Date of Patent: Jun. 7, 2022

(54) DISPLAY DEVICE

(71) Applicant: Samsung Display Co., Ltd., Yongin-si (KR)

(72) Inventors: Heerim Song, Yongin-si (KR); Mukyung Jeon, Yongin-si (KR); Iljoo Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 15/139,219

(22) Filed: Apr. 26, 2016

(65) Prior Publication Data

US 2017/0140706 A1   May 18, 2017

(30) Foreign Application Priority Data

Nov. 18, 2015 (KR) .................. 10-2015-0161728

(51) Int. Cl.
*G09G 3/3233* (2016.01)
*H01L 27/32* (2006.01)

(52) U.S. Cl.
CPC ... *G09G 3/3233* (2013.01); *G09G 2300/0819* (2013.01); *G09G 2300/0842* (2013.01); *G09G 2300/0861* (2013.01); *G09G 2310/0297* (2013.01); *G09G 2320/0238* (2013.01); *H01L 27/3276* (2013.01)

(58) Field of Classification Search
None
See application file for complete search history.

(56) References Cited

U.S. PATENT DOCUMENTS

| | | | | |
|---|---|---|---|---|
| 9,208,708 | B2* | 12/2015 | Kitadani | G09G 3/001 |
| 2003/0067458 | A1* | 4/2003 | Anzai | G09G 3/3225 345/204 |
| 2005/0264498 | A1* | 12/2005 | Asano | G09G 3/3233 345/76 |
| 2006/0103611 | A1* | 5/2006 | Choi | G09G 3/3233 345/82 |
| 2010/0053042 | A1 | 3/2010 | Kajiyama et al. | |
| 2011/0315991 | A1* | 12/2011 | Sugihara | G02F 1/136286 257/59 |
| 2012/0105412 | A1* | 5/2012 | Kang | G09G 3/3233 345/211 |
| 2012/0229438 | A1 | 9/2012 | Fujita | |
| 2013/0134986 | A1* | 5/2013 | Yun | G09G 3/006 324/543 |

(Continued)

FOREIGN PATENT DOCUMENTS

| | | |
|---|---|---|
| JP | 2010-60648 A | 3/2010 |
| KR | 10-2012-0103463 A | 9/2012 |

(Continued)

*Primary Examiner* — Benjamin X Casarez
(74) *Attorney, Agent, or Firm* — F. Chau & Associates, LLC

(57) ABSTRACT

This application relates to a display device. In one aspect, the display device includes a first data line extending in a first direction; and a second data line spaced apart from and parallel to the first data line. The display device also includes a pixel circuit electrically connected to one of the first and second data lines, and a shield line extending in the first direction and not disposed between the first and second data lines.

13 Claims, 13 Drawing Sheets

(56) References Cited

U.S. PATENT DOCUMENTS

| | | | |
|---|---|---|---|
| 2014/0118232 A1* | 5/2014 | Kim | H01L 27/3262 345/82 |
| 2014/0167009 A1* | 6/2014 | Lee | H01L 27/3272 257/40 |
| 2014/0184579 A1 | 7/2014 | Kim et al. | |
| 2014/0299843 A1 | 10/2014 | Kim | |
| 2015/0009105 A1* | 1/2015 | Nomura | G09G 3/006 345/76 |
| 2015/0061983 A1* | 3/2015 | Kim | G09G 3/3233 345/82 |
| 2015/0279278 A1* | 10/2015 | Park | G09G 3/3233 345/212 |
| 2016/0093247 A1* | 3/2016 | Lim | G09G 3/2003 345/694 |
| 2016/0163780 A1* | 6/2016 | Park | H01L 27/3248 257/40 |
| 2017/0125502 A1* | 5/2017 | Ota | H01L 27/3272 |
| 2017/0125506 A1* | 5/2017 | Kim | H01L 27/3265 |
| 2017/0169762 A1* | 6/2017 | Nomura | G09G 3/3233 |

FOREIGN PATENT DOCUMENTS

| | | |
|---|---|---|
| KR | 10-2014-0053602 | 5/2014 |
| KR | 10-2014-0085158 A | 7/2014 |
| KR | 10-2014-0120734 A | 10/2014 |

\* cited by examiner

DISPLAY DEVICE

CROSS-REFERENCE TO RELATED APPLICATION

This application claims the benefit of Korean Patent Application No. 10-2015-0161728, filed on Nov. 18, 2015, in the Korean Intellectual Property Office, the disclosure of which is incorporated herein in its entirety by reference.

BACKGROUND

Field

The described technology generally relates to a display device.

Description of the Related Technology

Among display devices, organic light-emitting diode (OLED) displays do not require a separate light source like a liquid crystal display (LCD), and thus, the OLED display can be made to be thin and lightweight. These displays have desirable characteristics such as low power consumption, high luminance, and rapid response rate.

As resolution of display devices increases, the line time for driving a single row may decrease and the time for compensating a threshold voltage of a driving transistor may become insufficient.

SUMMARY OF CERTAIN INVENTIVE ASPECTS

One inventive aspect relates to a pixel structure for reducing crosstalk between signal lines.

Another aspect is a display device that includes a first data line extending in a first direction; a second data line spaced apart from and parallel to the first data line; a pixel circuit connected to one of the first and second data lines; and a shield line extending in the first direction on an outer side of the first data line or the second data line.

The shield line may be electrically connected to a voltage line providing a constant voltage.

The display device may further include a driving voltage line that extends in the first direction between the first and second data lines and provides a first power voltage. The shield line may be electrically connected to the driving voltage line.

The driving voltage line and the shield line may be provided on a same layer.

The display device may further include an initialization voltage line that intersects the first and second data lines and extends in a second direction that is perpendicular to the first direction. The shield line may be electrically connected to the initialization voltage line.

The shield line may be provided above or under the initialization voltage line.

The display device may further include a driving voltage line that extends in the first direction between the first and second data lines and provides a first power voltage. The shield line may be electrically connected to a voltage line that provides a second power voltage that is different from the first power voltage.

The driving voltage line and the shield line may be provided on a same layer.

Another aspect is a display device that includes a first data line extending in a first direction; a second data line spaced apart from and parallel to the first data line; a first pixel circuit connected to one of the first and second data lines; a first driving voltage line provided between the first and second data lines; a third data line spaced apart from and parallel to the second data line; a fourth data line spaced apart from and parallel to the third data line; a second pixel circuit connected to one of the third data line and the fourth data line; a second driving voltage line provided between the third data line and the fourth data line; and a shield line extending in the first direction and provided between the second data line and the third data line.

The shield line may be electrically connected to a voltage line that provides a constant voltage.

The shield line may be electrically connected to the first driving voltage line and the second driving voltage line.

The first driving voltage line, the second driving voltage line, and the shield line may be provided on a same layer.

The display device may further include an initialization voltage line that intersects the first to fourth data lines and extends in a second direction that is perpendicular to the first direction. The shield line may be electrically connected to the initialization voltage line.

The shield line may be provided above or under the initialization voltage line.

The first driving voltage line and the second driving voltage line may provide a first power voltage, and the shield line may be electrically connected to a voltage line that provides a second power voltage that is different from the first power voltage.

The first driving voltage line, the second driving voltage line, and the shield line may be provided on a same layer.

Another aspect is a display device that includes a pixel unit in which a plurality of pixels are arranged as a matrix. The pixel unit is divided to at least one pixel area, and a preset constant voltage is applied to each of the pixel areas via the shield line, and each of the plurality of pixels includes a first data line extending in a first direction; a second data line spaced apart from and parallel to the first data line; a pixel circuit connected to one of the first and second data lines; and a shield line extending in the first direction on an outer side of the first data line or the second data line.

The display device may further include a driving voltage line that extends in the first direction between the first and second data lines and provides a first power voltage. A shield line of a pixel located in at least one of the pixel areas may be electrically connected to the driving voltage line.

The display device may further include an initialization voltage line that intersects the first and second data lines and extends in a second direction that is perpendicular to the first direction. A shield line of a pixel located in at least one of the pixel areas may be electrically connected to the initialization voltage line.

The display device may further include a driving voltage line that extends in the first direction between the first and second data lines and provides a first power voltage. A shield line of a pixel located in at least one of the pixel areas may be electrically connected to a voltage line that provides a second power voltage that is different from the first power voltage.

Another aspect is a display device comprising: a first data line extending in a first direction; a second data line spaced apart from and parallel to the first data line; a pixel circuit electrically connected to one of the first and second data lines; and a shield line extending in the first direction and not formed between the first and second data lines.

The above display device further comprises a voltage line having a substantially constant voltage, wherein the shield line is electrically connected to the voltage line.

The above display device further comprises a driving voltage line having a first power voltage and extending in the first direction between the first and second data lines, wherein the shield line is electrically connected to the driving voltage line.

In the above display device, the driving voltage line and the shield line are provided on the same layer.

The above display device further comprises an initialization voltage line intersecting the first and second data lines and extending in a second direction crossing the first direction, wherein the shield line is electrically connected to the initialization voltage line.

In the above display device, the shield line is provided over the initialization voltage line.

The above display device further comprises i) a first driving voltage line having a first power voltage and extending in the first direction between the first and second data lines and ii) a second voltage line having a second power voltage different from the first power voltage, wherein the shield line is electrically connected to the second voltage line.

In the above display device, the first driving voltage line and the shield line are provided on the same layer.

Another aspect is a display device comprising: a first data line extending in a first direction; a second data line spaced apart from and parallel to the first data line; a first pixel circuit electrically connected to one of the first and second data lines; a first driving voltage line provided between the first and second data lines; a third data line spaced apart from and parallel to the second data line; a fourth data line spaced apart from and parallel to the third data line; a second pixel circuit electrically connected to one of the third and fourth data lines; a second driving voltage line provided between the third and fourth data lines; and a shield line extending in the first direction and provided between the second and third data lines.

The above display device further comprises a voltage line having a substantially constant voltage and electrically connected to the shield line.

In the above display device, the shield line is electrically connected to the first and second driving voltage lines.

In the above display device, the first driving voltage line, the second driving voltage line, and the shield line are provided on the same layer.

The above display device further comprises an initialization voltage line intersecting the first to fourth data lines and extending in a second direction crossing the first direction, wherein the shield line is electrically connected to the initialization voltage line.

In the above display device, the shield line is provided over the initialization voltage line.

In the above display device, the first and second driving voltage lines have a first power voltage, wherein the display device further comprises a voltage line electrically connected to the shield line and having a second power voltage that is different from the first power voltage.

In the above display device, the shield line is not provided between the first and second data lines.

Another aspect is a display device comprising: a pixel unit including a matrix of pixels, wherein the pixel unit includes at least one pixel area, and wherein each pixel area is configured to receive a preset constant voltage via the shield line. Each of the pixels comprises: a first data line extending in a first direction; a second data line spaced apart from and parallel to the first data line; a pixel circuit electrically connected to one of the first and second data lines; and a shield line extending in the first direction and not formed between the first and second data lines.

The above display device further comprises a driving voltage line having a first power voltage and extending in the first direction between the first and second data lines, wherein the shield line of a selected one of the pixels is electrically connected to the driving voltage line.

The above display device further comprises an initialization voltage line intersecting the first and second data lines and extending in a second direction crossing the first direction, wherein the shield line of a selected one of the pixels is electrically connected to the initialization voltage line.

The above display device further comprises i) a driving voltage line having a first power voltage and extending in the first direction between the first and second data lines and ii) a different voltage line having a second power voltage different from the first power voltage, wherein the shield line of a selected one of the pixels is electrically connected to the different voltage line.

DETAILED DESCRIPTION OF CERTAIN INVENTIVE EMBODIMENTS

Figure 1:
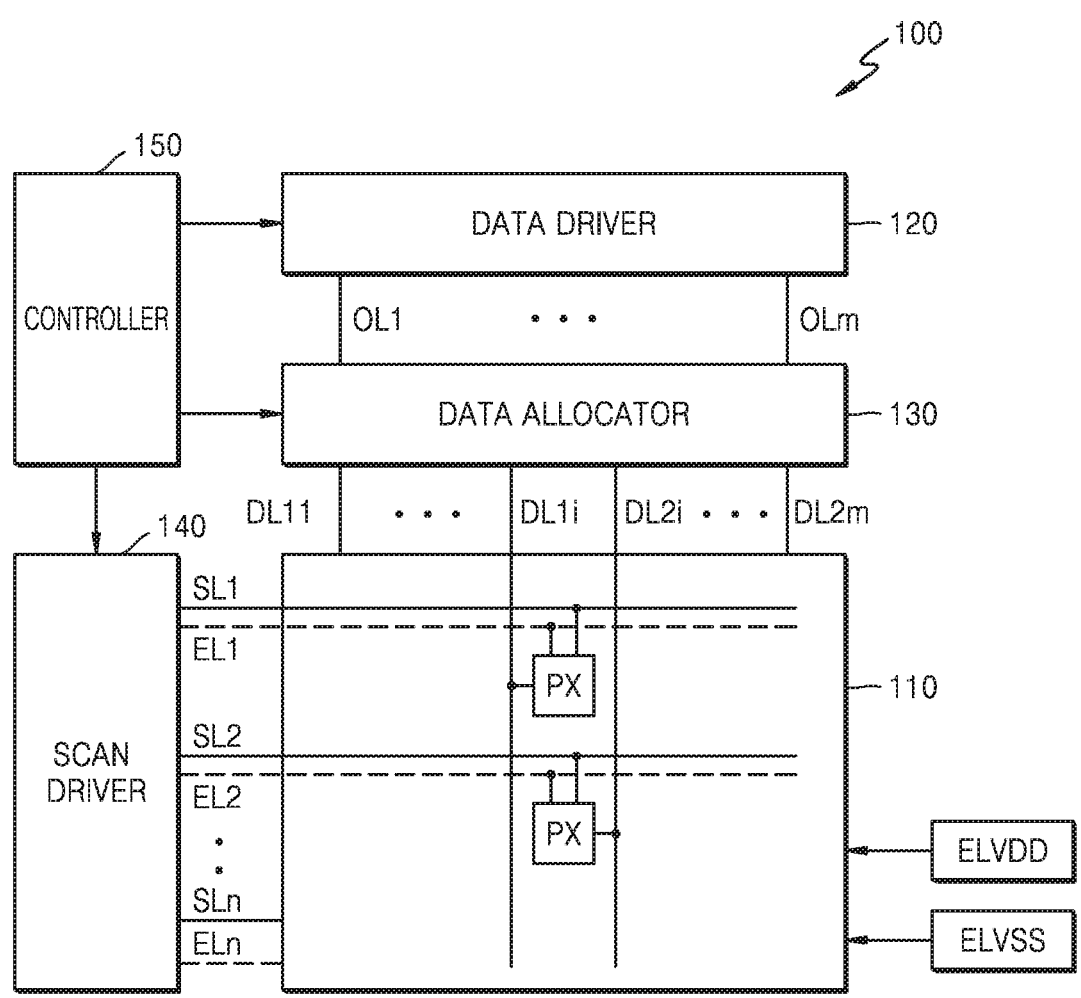
FIG. 1 is a schematic diagram of a display device according to an embodiment.

To increase the time for threshold voltage compensation, data demultiplexing can be used. However, crosstalk may occur between signal lines due to an increase in the number of signal lines provided in a pixel of a high resolution display device.

As the described technology allows for various changes and numerous embodiments, particular embodiments will be illustrated in the drawings and described in the written description. The effect and features of the described technology and the method of realizing the effect and the features will be clear with reference to the embodiments described below with reference to the drawings. However, the described technology may be embodied in various forms and should not be construed as being limited to the embodiments. As used herein, the term "and/or" includes any and all combinations of one or more of the associated listed items. Expressions such as "at least one of," when preceding a list of elements, modify the entire list of elements and do not modify the individual elements of the list.

Hereinafter, the embodiments will be described with reference to the drawings. In order to clearly describe the described technology, elements and features that are irrelevant to the described technology are omitted Like reference numerals refer to like elements in the drawings, and thus, descriptions of similar or identical elements will not be repeated.

It will be understood that although the terms "first", "second", etc. may be used herein to describe various components, these components should not be limited by these terms. These components are only used to distinguish one component from another. As used herein, the singular forms "a," "an" and "the" are intended to include the plural forms as well, unless the context clearly indicates otherwise.

Sizes of elements in the drawings may be exaggerated for convenience of explanation. In other words, since sizes and thicknesses of components in the drawings are arbitrarily illustrated for convenience of explanation, the described technology is not limited thereto.

In the present disclosure, the terms "corresponding" or "correspondingly" may indicate that components are arranged or connected at the same column or a row in context. For example, when a first component is connected to a "corresponding" second component from among a plurality of second components, this indicates that the first component is connected to the second component that is provided at the same column or the same row as the first component. In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

FIG. 1 is a schematic diagram of a display device 100 according to an embodiment.

Referring to FIG. 1, the display device 100 includes a pixel unit 110, a data driver 120, a data allocator 130, a scan driver 140, and a controller 150. The display device 100 may be an OLED display.

The pixel unit 110 may include a plurality of scan lines SL1 to SLn, a plurality of data lines DL11 to DL2m, a plurality of emission control lines EL1 to ELn, and a plurality of pixels PX.

The scan lines SL1 to SLn are arranged in rows and transmit scan signals. Scan lines connected to each of pixels may include a first scan line GILn applying a first scan signal GIn, a second scan line GWLn applying a second scan signal GWn, and a third scan line GBLn applying a third scan signal GBn (refer to FIG. 2).

The data lines DL11 to DL2m are arranged in columns and transmitting data signals. Two data lines are arranged for each column, and each of the two data lines per column includes a first data line DL1 connected to a pixel PX in an odd row and a second data line DL2 connected to a pixel PX in an even row. The first and second data lines DL1 and DL2 are adjacent to each other and alternately connected to the pixels PX located at the same column. The first and second data lines DL1 and DL2 may be alternately arranged in a row.

The scan lines SL1 to SLn and the data lines DL11 to DL2m may be arranged as a matrix, and the pixels PX may be provided at intersections. A first power voltage ELVDD and a second power voltage ELVSS are applied to each of the pixels PX of the pixel unit 110. The second power voltage ELVSS may be a lower voltage than the first power voltage ELVDD.

The emission control lines EL1 to ELn transmit emission control signals.

The data driver 120 may be connected to a plurality of output lines OL1 to OLm, and the output lines OL1 to OLm may be connected to the data lines DL11 to DL2m via the data allocator 130. The data driver 120 may respond to controls signals from the controller 150 and transform image signals into data signals in the form of a voltage or current. The data driver 120 may apply the data signals to the output lines OL1 to OLm.

Each of the data lines DL11 to DL2m may include a data capacitor. The data capacitor may temporarily store the data signals that are applied to the data lines DL11 to DL2m, and apply the stored data signals to the pixels PX. A parasitic capacitor, which is equivalently formed on the data lines DL11 to DL2m, may be used as the data capacitor. Alternatively, capacitors may be additionally formed for each data line and be used as data capacitors.

The data allocator 130 may be connected to the output lines OL1 to OLm and the data lines DL11 to DL2m. The data allocator 130 may be provided as m demultiplexers that include a plurality of switches. The number of demultiplexers included in the data allocator 130 may be the same as the number of output lines. An end of each of the demultiplexers may be connected to any one of the output lines OL1 to OLm. Also, another end of each of the demultiplexers may be connected to the first and second data lines DL1 and DL2. The demultiplexers apply data signals from one output line to two data lines. By including the demultiplexers, the number of output lines connected to the data driver 120 does not have to be equal to the number of data lines, and thus, manufacturing cost may be reduced by connecting fewer output lines to the data driver 120 and including fewer integrated circuits in the data driver 120.

The demultiplexer may apply data signals to some data lines that are connected to that demultiplexer during a first horizontal period, and apply data signals to data lines other than the aforementioned data lines during a second horizontal period. In this case, data lines that receive data signals during the same horizontal period may be connected to pixels PX located at the same row. In response to a control signal from the controller 150, during a certain horizontal period, the demultiplexer may sequentially apply data signals to the first data lines DL1 connected to pixels in odd rows, and then, during a following horizontal period, sequentially apply data signals to the second data lines DL2 connected to pixels in even rows. For example, in response to a control signal from the controller 150, the demultiplexer applies, while the second scan signal GWn is being applied to the pixels in the odd rows, data signals to the second data lines DL2 connected to the pixels in the even rows connected to that demultiplexer, and applies, while the second scan signal GWn is being applied to the pixels in the even rows, data signals to the first data lines DL1 connected to the pixels in the odd rows connected to that demultiplexer. While the second scan signal GWn is applied to a j-th scan line, data signals corresponding to a (j+1)-th row are applied.

The scan driver 140 is connected to the scan lines SL1 to SLn, generates scan signals in response to a control signal from the controller 150, and applies the scan signals to the scan lines SL1 to SLn. Also, the scan driver 140 is connected to the emission control lines EL1 to ELn, generates emission control signals in response to a control signal from the controller 150, and applies the emission control signals to the emission control lines EL1 to ELn. According to the embodiment of FIG. 1, the scan driver 140 generates and applies the emission control signals to the pixel unit 110. Alternatively, an additional emission controller may generate and apply the emission control signals to the pixel unit 110.

The controller 150 may generate control signals in response to synchronization signals applied from an external source. The controller 150 may output a control signal for controlling the data driver 120 to the data driver 120, and output a control signal for controlling the scan driver 140 to the scan driver 140. The controller 150 may apply the control signals to each of the demultiplexers. In this case, the controller 150 may control application of the control signals such that the data signals may be applied in row units.

Figure 2:
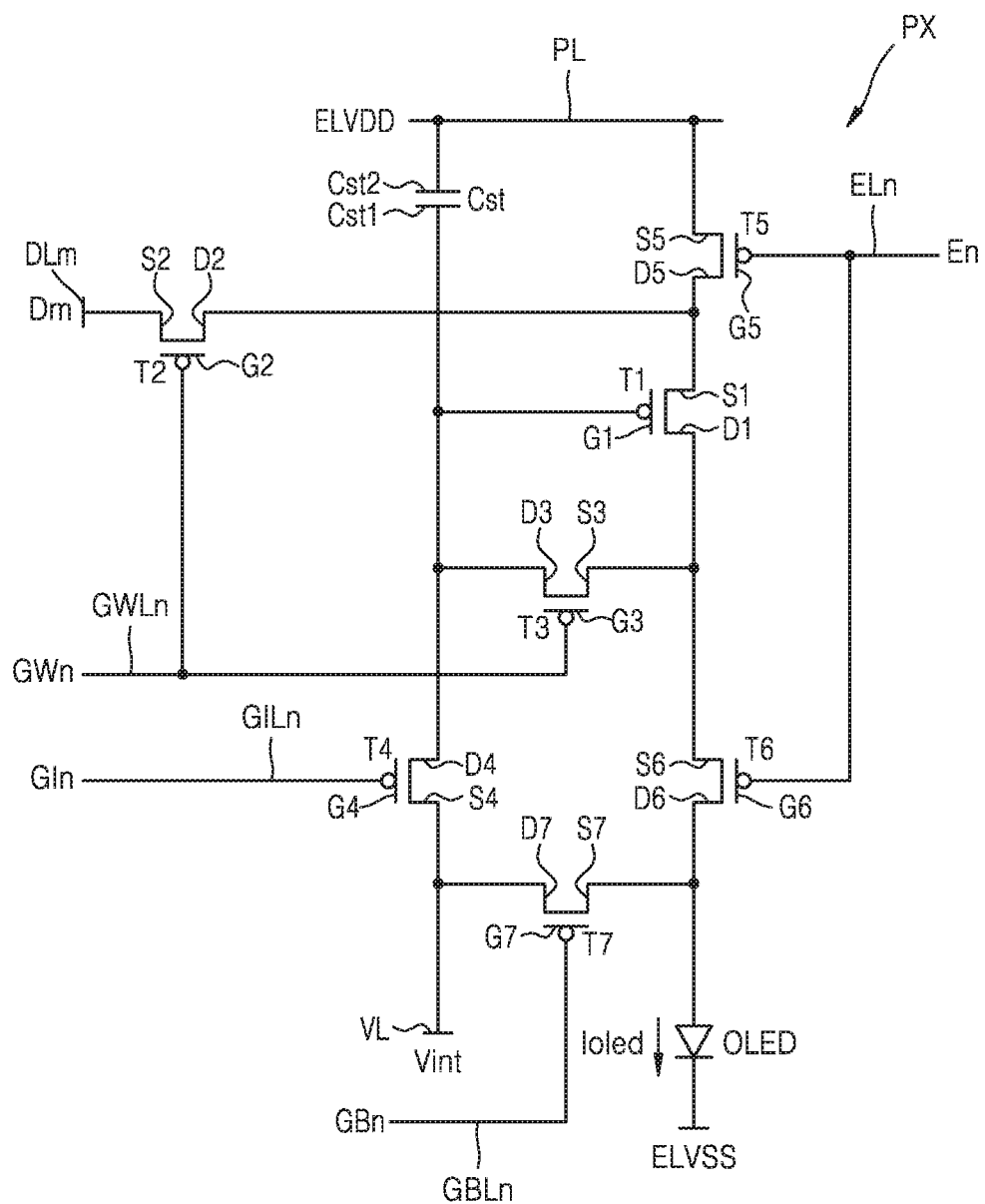
FIG. 2 is an equivalent circuit diagram of a pixel according to an embodiment.

FIG. 2 is an equivalent circuit diagram of a pixel PX according to an embodiment.

Referring to FIG. 2, the pixel PX includes a pixel circuit including first to seventh transistors T1 to T7 and a capacitor Cst, and a light-emitting unit connected to the pixel circuit. The light-emitting unit may be an OLED. The OLED may include a first electrode, a second electrode, and an emission layer between the first and second electrodes. The second electrode of the OLED is connected to a second power source that supplies the second power voltage ELVSS.

The pixel PX is connected to a first scan line GILn transmitting the first scan signal GIn to the fourth transistor T4, a second scan line GWLn transmitting the second scan signal GWn to the second transistor T2 and the third transistor T3, an emission control line ELn transmitting an emission control signal En to the fifth transistor T5 and the sixth transistor T6, a data line DLm transmitting data signals Dm, a driving voltage line PL transmitting the first power voltage ELVDD, an initialization voltage line VL transmitting an initialization voltage Vint for initializing the first transistor T1, and a third scan line GBLn transmitting the third scan signal GBn to the seventh transistor T7. The data line DLm may be a first data line DL1m or a second data line DL2m.

The first transistor T1 may include a gate electrode G1 connected to a first electrode Cst1 of the capacitor Cst, a first electrode S1 connected to the driving voltage line PL via the fifth transistor T5, and a second electrode D1 electrically connected to a first electrode of the OLED via the sixth transistor T6. The first transistor T1 may function as a driving transistor, and may receive data signals according to a switching operation of the second transistor T2 and apply current to the OLED.

The second transistor T2 may include a gate electrode G2 connected to the second scan line GWLn, a first electrode S2 connected to the data line DLm, and a second electrode D2 connected to the first electrode S1 of the first transistor T1. The second transistor T2 may be turned on according the second scan signal GWn received via the second scan line GWLn, and may perform a switching operation of transmitting data signals transmitted via the data line DLm to the first electrode S1 of the first transistor T1.

The third transistor T3 may include a gate electrode G3 connected to the second scan line GWLn, a first electrode S3 connected to the second electrode D1 of the first transistor T1, and a second electrode D3 connected to the first electrode Cst1 of the capacitor Cst, a second electrode D4 of the fourth transistor T4, and the gate electrode G1 of the first transistor T1. The third transistor T3 may be turned on according to the second scan signal GWn received via the second scan line GWLn, and diode-connect the first transistor T1.

The fourth transistor T4 may include a gate electrode G4 connected to the first scan line GILn, a first electrode S4 connected to the initialization voltage line VL, and the second electrode D4 connected to the first electrode Cst1 of the capacitor Cst, the second electrode D3 of the third transistor T3, and the gate electrode G1 of the first transistor T1. The fourth transistor T4 may be turned on according to the first scan signal Gin received via the first scan line GILn, and perform an initialization operation of initializing a gate voltage of the first transistor T1 by transmitting the initialization voltage Vint to the gate electrode G1 of the first transistor T1.

The fifth transistor T5 may include a gate electrode G5 connected to the emission control line ELn, a first electrode S5 connected to the driving voltage line PL, and a second electrode D5 connected to the first electrode S1 of the first transistor T1 and the second electrode D2 of the second transistor T2.

The sixth transistor T6 may include a gate electrode G6 connected to the emission control line ELn, a first electrode S6 connected to the second electrode D1 of the first transistor T1 and the first electrode S3 of the third transistor T3, and a second electrode D6 connected to the first electrode of the OLED.

The fifth and sixth transistors T5 and T6 may be simultaneously turned on according to the emission control signal En received via the emission control line ELn, and thus, current may flow through the OLED.

The seventh transistor T7 may include a gate electrode G7 connected to the third scan line GBLn, a first electrode S7 connected to the second electrode D6 of the sixth transistor T6 and the first electrode of the OLED, and a second electrode D7 connected to the initialization voltage line VL. The seventh transistor T7 may be turned on according to the third scan signal GBn received via the third scan line GBLn, and may perform an initialization operation of initializing a voltage of the first electrode of the OLED by transmitting the initialization voltage Vint to the first electrode of the OLED.

According to another embodiment, the third scan line GBLn connected to the gate electrode G7 of the seventh transistor T7 is the first scan line GILn or the second scan line GWLn, and the third scan signal GBn may be the first scan signal Gin or the second scan signal GWn.

The capacitor Cst may include the first electrode Cst1 connected to the gate electrode G1 of the first transistor T1, the second electrode D3 of the third transistor T3, and the second electrode D4 of the fourth transistor T4, and a second electrode Cst2 connected to the driving voltage line PL.

An operation process will be briefly described below. First, the first scan signal Gin is applied to the first scan line GILn, and thus the fourth transistor T4 is turned on. When the fourth transistor T4 is turned on, the initialization voltage Vint is applied to the gate electrode G1 of the first transistor T1, and thus, a voltage of the gate electrode G1 of the first transistor T1 is initialized as the initialization voltage Vint.

Second, the second scan signal GWn is applied to the second scan line GWLn, and thus the second transistor T2 and the third transistor T3 are turned on. When the third transistor T3 is turned on, the first transistor T1 is diode-connected. When the first transistor T1 is diode-connected, the data signals Dm and a voltage corresponding to a threshold voltage of the first transistor T1 are applied to the gate electrode G1 of the first transistor T1. When the second transistor T2 is turned on, the data signals Dm is transmitted from the data line DLm to the first electrode S1 of the first transistor T1.

Third, the third scan signal GBn is applied to the third scan line GBLn, and thus the seventh transistor T7 is turned on. When the seventh transistor T7 is turned on, an anode of the OLED is initialized as the initialization voltage Vint.

Fourth, the emission control signal En is applied to the emission control line ELn, and thus the fifth transistor T5 and the sixth transistor T6 are turned on. Then, in response to the voltage applied to the gate electrode G1, the first transistor T1 controls an amount of current flowing from the first power voltage ELVDD to the second power voltage ELVSS via the OLED. In this case, the OLED generates light with predetermined luminance in response to the amount of current.

Figure 3:
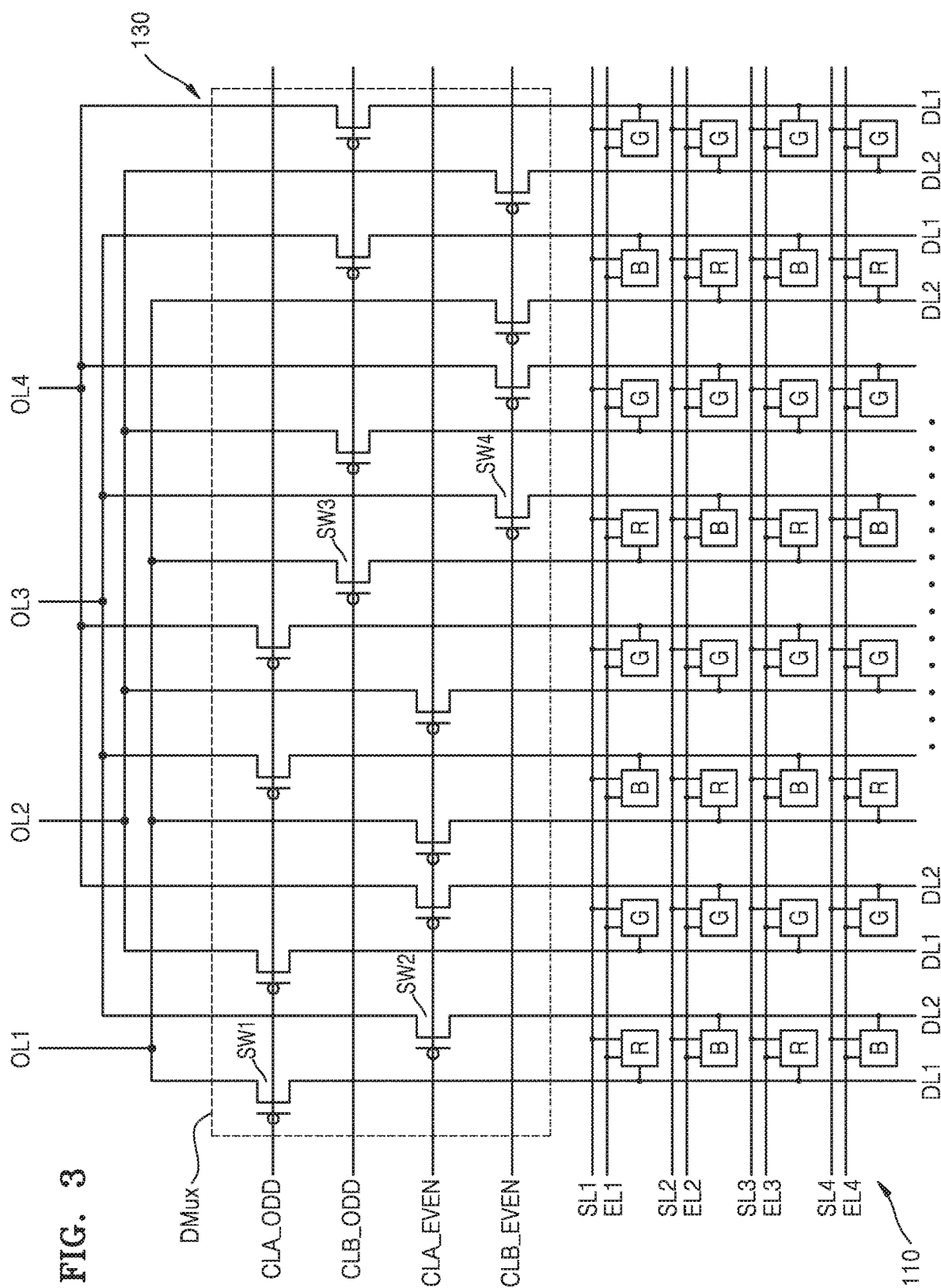
FIG. 3 is a schematic diagram of some components of the display device of FIG. 1.
Figure 4:
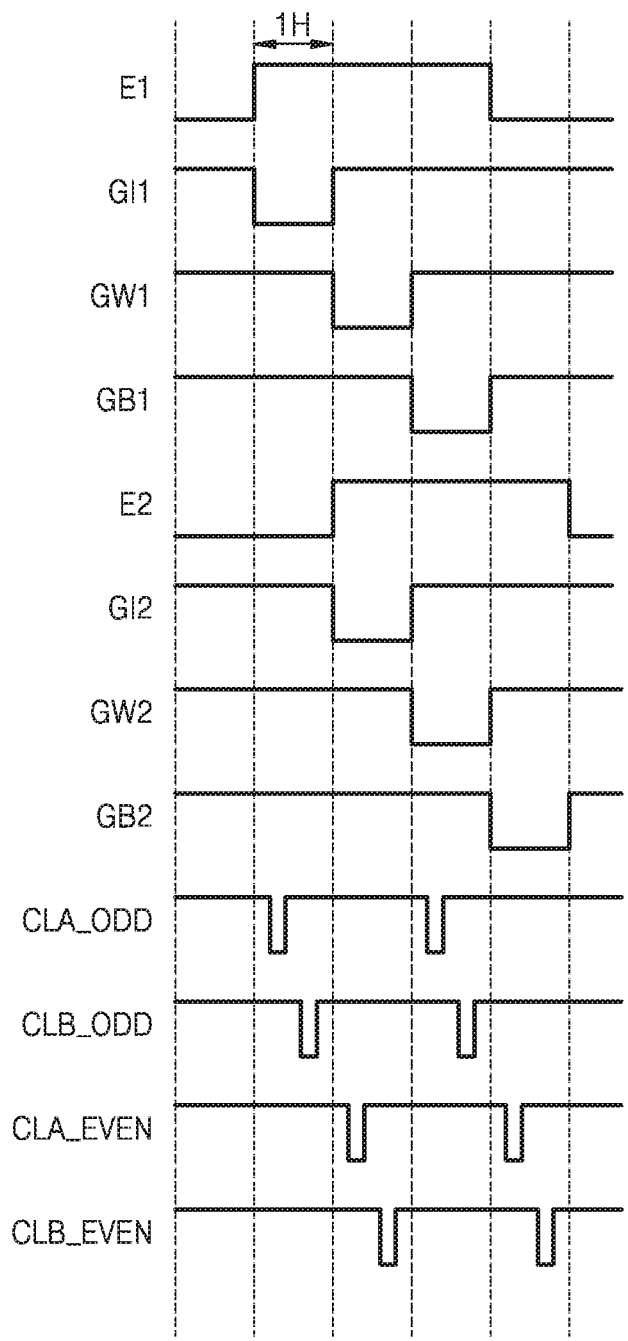
FIG. 4 is a timing diagram for describing a method of driving the display device of FIG. 3.

FIG. 3 is a schematic block diagram of some components of the display device 100 of FIG. 1. FIG. 4 is a timing diagram for describing a method of driving the display device 100 of FIG. 3.

The pixel unit 110 includes first pixels, second pixels, and third pixels, which emit light with different colors. The first pixels and the second pixels are alternately arranged in the same column, and the third pixels are arranged in a column adjacent to the column in which the first and second pixels are arranged. The first pixel may be a red pixel R emitting red light, the second pixel may be a blue pixel B emitting blue light, and the third pixel may be a green pixel G emitting green light. The red pixel R and the blue pixel B are alternately arranged in the same column, and the green pixel G is arranged in a column adjacent to the column in which the red pixel R and the blue pixel B are arranged.

Two data lines, e.g., the first data line DL1 connected to the pixel PX in the odd row and the second data line DL2 connected to the pixel PX in the even row, may be parallel to one another in each column. In an embodiment, light emitted by the pixel PX connected to the first data line DL1 has a different color from light emitted by the pixel PX connected to the second data line DL2. In another embodiment, the pixel PX connected to the first data line DL1 has a different size from the pixel PX connected to the second data line DL2.

In a first column of FIG. 3, the red pixel R is connected to the first data line DL1, and the blue pixel B is connected to the second data line DL2. In a third column of FIG. 3, the blue pixel B is connected to the first data line DL1, and the red pixel R is connected to the second data line DL2. In second and fourth columns of FIG. 3, the green pixel G is connected to the first data line DL1 and the second data line DL2.

In the embodiment of FIG. 3, an alternating order of the first and second data lines DL1 and DL2 in the first and second columns is different from an alternating order of the first and second data lines DL1 and DL2 in the third and fourth columns. However, embodiments are not limited thereto. The alternating order of the first and second data lines DL1 and DL2 may be identical in a row direction.

The data allocator 130 may be provided between first to fourth output lines OL1 to OL4 and the first and second data lines DL1 and DL2 corresponding to the first to eighth columns, and include a demultiplexer that includes first to fourth switches SW1 to SW4. The demultiplexer may be provided on every eighth column.

The first switch SW1 may be turned on by a first clock signal CLA_ODD, and apply data signals applied to the first to fourth output lines OL1 to OL4 to each of the first data lines DL1 of the first to fourth columns. The second switch SW2 may be turned on by a second clock signal CLA_EVEN, and apply the data signals applied to the first to fourth output lines OL1 to OL4 to each of the second data lines DL2 of the first to fourth columns. The third switch SW3 may be turned on by a third clock signal CLB_ODD, and apply the data signals applied to the first to fourth output lines OL1 to OL4 to each of the first data lines DL1 of the fifth to eighth columns. The fourth switch SW4 may be turned on by a fourth clock signal CLB_EVEN, and apply the data signals applied to the first to fourth output lines OL1 to OL4 to each of the second data lines DL2 of the fifth to eighth columns.

While the first scan signal GIn is being applied to the pixel PX, corresponding data signals are applied to a corresponding (or connected) first data line DL1 or a corresponding (or connected) second data line DL2. Afterwards, while the second scan signal GWn is being applied to the pixel PX, the data signals applied to the corresponding first data line DL1 or the corresponding second data line DL2 may be applied to the pixel PX via the second transistor T2. The first scan signal GI, the second scan signal GWn, and the third scan signal GB may be sequentially applied along rows in 1 horizontal period (1H) units.

Referring to FIG. 4, while a first scan signal GI1 is being applied to the pixels PX of a first row, the first clock signal CLA_ODD and the third clock signal CLB_ODD are applied to the data allocator 130. The first switches SW1 may be turned on by the first clock signal CLA_ODD, and the third switches SW3 are turned on by the third clock signal CLB_ODD. Accordingly, data signals of the first row are applied to the first data lines DL1. Next, a second scan signal GW1 is applied to the pixels PX of the first row, and the data signals stored in the first data lines DL1 are applied to the pixels PX of the first row. Similarly, while a first scan signal GI2 is being applied to the pixels PX of a second row, the second clock signal CLA_EVEN and the fourth clock signal CLB_EVEN are applied to the data allocator 130. The second switches SW2 are turned on by the second clock signal CLA_EVEN, and the fourth switches SW4 are turned on by the fourth clock signal CLB_EVEN. Accordingly, data signals of the second row are applied to the second data lines DL2. Next, a second scan signal GW2 is applied to the pixels PX in the second row, and the data signals stored in the second data lines DL2 are applied to the pixels PX of the second row. The second scan signal GW1 applied to the pixels PX of the first row mutually overlap the first scan signal GI2 applied to the pixels PX of the second row. Also, although not illustrated, the second scan signal GW2 applied to the pixels PX of the second row mutually overlap a first scan signal GI3 applied to the pixels PX of a third row.

The display device according to an embodiment may obtain a sufficient amount compensation time by separating pixel threshold voltage compensation time and data writing time.

The described technology is not limited to the aforementioned configuration of the demultiplexer and a timing diagram of a clock signal. Various embodiments of the configuration of the demultiplexer and timing of the clock signal may be provided to drive a pixel unit in which two data lines are arranged in one pixel.

Figure 5:
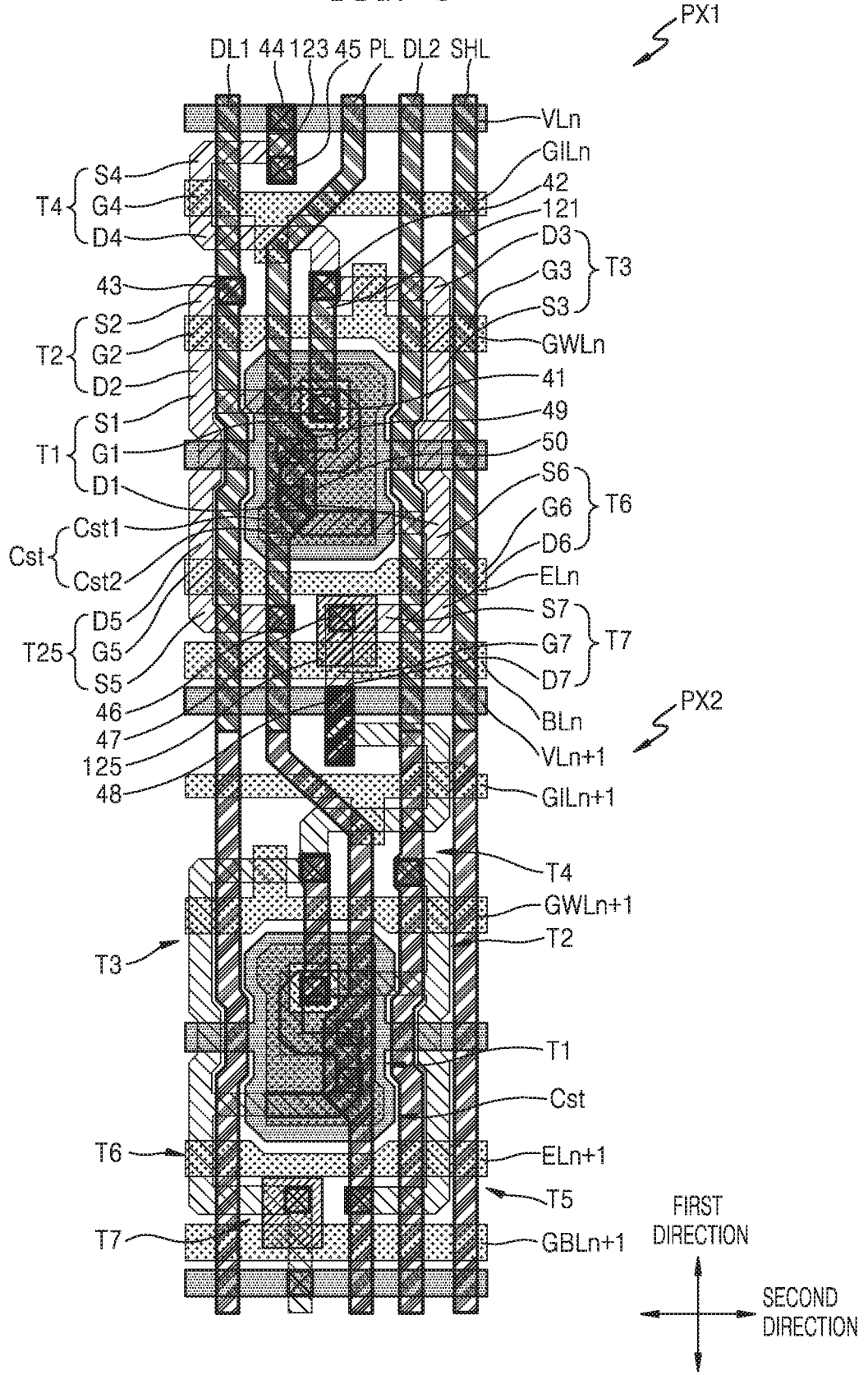
FIG. 5 is a schematic plan view of a first pixel in an odd row and a second pixel in an even row on an arbitrary column, according to an embodiment.

FIG. 5 is a schematic plan view of a first pixel PX1 in an odd row and a second pixel PX2 in an even row on an arbitrary column, according to an embodiment.

FIG. 5 shows the first pixel PX1 in an n-th row of an arbitrary column on a substrate and the second pixel PX2 in an (n+1)-th row of the arbitrary column on the substrate. The n-th row may be an odd row and the (n+1)-th row may be an even row. In FIG. 5, the OLED is not illustrated, and only a pixel circuit is illustrated.

The first pixel PX1 and the second pixel PX2 respectively include initialization voltage lines VLn and VLn+1 applying the initialization voltage Vint, first scan lines GILn and GILn+1 applying the first scan signal GIn, second scan lines GWLn and GWLn+1 applying the second scan signal GWn, emission control lines ELn and ELn+1 applying the emission control signal En, and third scan lines GBLn and GBLn+1 applying the third scan signal GBn. The initialization voltage lines VLn and VLn+1, the first scan lines GILn and GILn+1, the second scan lines GWLn and GWLn+1, the emission control lines ELn and ELn+1, and the third scan lines GBLn and GBLn+1 may be spaced apart from each other by a predetermined distance and parallel to one another in a second direction (row direction). The first data line DL1 at a left side, the second data line DL2 at a right side, the driving voltage line PL, and a shield line SHL may be spaced apart by a predetermined distance and parallel to one another in a first direction (column direction). The first pixel PX1 is connected to the first data line DL1. The second pixel PX2 is connected to the second data line DL2.

According to the embodiment of FIG. 5, the first data line DL1 is at the left side and the second data line DL2 is at the right side. However, the described technology is not limited thereto, and the first data line DL1 may be at the right side and the second data line DL2 may be at the left side.

The first and second pixels PX1 and PX2 may have a vertical flip structure, e.g., a left and right arrangement of first to seventh transistors T1 to T7 of the first pixel PX1 is opposite to that of the second pixel PX2. However, a connection relationship between the first to seventh transistors T1 to T7 and the capacitor Cst is identical. Hereinafter, the connection relationship between the first to seventh transistors T1 to T7 and the capacitor Cst of the first pixel PX1 will be mainly described, but the description may also apply to that of the second pixel PX2.

Transistors are formed on a semiconductor layers having various shapes. The semiconductor layer may be formed by using, for example, polysilicon, and may include a channel area that is not doped with impurities, and source and drain areas that are formed at two sides of the channel area by doping with impurities. The impurity may vary according to a type of the transistor. For example, the impurity includes an n-type impurity or a p-type impurity.

The first transistor T1 may include the gate electrode G1, the first electrode S1, and the second electrode D1. The first electrode S1 may correspond to a source area doped with impurities in the semiconductor layer, and the second electrode D1 may correspond to a drain area doped with impurities in the semiconductor layer. The gate electrode G1 may overlap a channel area. The gate electrode G1 may be electrically connected to a connecting electrode 121 via a contact hole 41, and the connecting electrode 121 may be electrically connected to the second electrode D3 of the third transistor T3 and the second electrode D4 of the fourth transistor T4 via the contact hole 42. The gate electrode G1 may function as the first electrode Cst1 of the capacitor Cst.

A semiconductor layer of the first transistor T1 may be curved. According to the example of FIG. 5, the semiconductor layer of the first transistor T1 of the first pixel PX1 may be arranged in the shape of an inverse 'S,' and a semiconductor layer of the first transistor T1 of the second pixel PX2 may be arranged in the shape of the letter 'S.' When the semiconductor layer is curved, the semiconductor layer may be elongated in a small area. Therefore, since the semiconductor layer of the first transistor T1 may have a long channel area, a driving range of a gate voltage applied to the gate electrode G1 may be widened. The shape of the semiconductor layer of the first transistor T1 is not limited to above, and may correspond to the letter 'M' or 'W.'

The first electrode S1 of the first transistor T1 of the first pixel PX1 may be located at a left side of the capacitor Cst, and the second electrode D1 may be located at a right side of the capacitor Cst. The first electrode S1 of the first transistor T1 of the second pixel PX2 may be located at the right side of the capacitor Cst, and the second electrode D1 may be located at the left side of the capacitor Cst.

The second transistor T2 may include the gate electrode G2, the first electrode S2, and the second electrode D2. The first electrode S2 may correspond to a source area doped with impurities in the semiconductor layer, and the second electrode D2 may correspond to a drain area doped with impurities in the semiconductor layer. The gate electrode G2 may overlap a channel area. The first electrode S2 may be electrically connected to the first data line DL1 via a contact hole 43. The second electrode D2 may be connected to the first electrode S1 of the first transistor T1 and the second electrode D5 of the fifth transistor T5. The gate electrode G2 may be formed based on a portion of the second scan line GWLn. The second transistor T2 of the first pixel PX1 may be located at the left side, and the second transistor T2 of the second pixel PX2 may be located at the right side.

The third transistor T3 may include the gate electrode G3, the first electrode S3, and the second electrode D3. The first electrode S3 may correspond to a source area doped with impurities in the semiconductor layer, and the second electrode D3 may correspond to a drain area doped with impurities in the semiconductor layer. The gate electrode G3 may overlap a channel area, and formed as a dual gate electrode based on a portion of the second scan line GWLn to thus prevent leakage current. The third transistor T3 of the first pixel PX1 may be located at the right side, and the third transistor T3 of the second pixel PX2 may be located at the left side.

The fourth transistor T4 may include the gate electrode G4, the first electrode S4, and the second electrode D4. The first electrode S4 may correspond to a source area doped with impurities in the semiconductor layer, and the second electrode D4 may correspond to a drain area doped with impurities in the semiconductor layer. The first electrode S4 may be electrically connected to the initialization voltage line VLn via a contact hole 44. The gate electrode G4 may overlap a channel area, and may be formed as a dual gate electrode based on a portion of the first scan line GILn to thus prevent leakage current. The first electrode S4 may be electrically connected to a connecting electrode 123 via a contact hole 45, and the connecting electrode 123 may be electrically connected to the initialization voltage line VLn via the contact hole 44. The fourth transistor T4 of the first pixel PX1 may be located at the left side, and the fourth transistor T4 of the second pixel PX2 may be located at the right side.

The fifth transistor T5 may include the gate electrode G5, the first electrode S5, and the second electrode D5. The first electrode S5 may correspond to a source area doped with impurities in the semiconductor layer, and the second electrode D5 may correspond to a drain area doped with impurities in the semiconductor layer. The gate electrode G5 may overlap a channel area. The first electrode S5 may be connected to the driving voltage line PL via a contact hole 46. The gate electrode G5 may be formed based on a portion of the emission control line ELn. The fifth transistor T5 of the first pixel PX1 may be located at the left side, and the fifth transistor T5 of the second pixel PX2 may be located at the right side.

The sixth transistor T6 may include the gate electrode G6, the first electrode S6, the second electrode D6. The first electrode S6 may correspond to a source area doped with impurities in the semiconductor layer, and the second electrode D6 may correspond to a drain area doped with impurities in the semiconductor layer. The gate electrode G6 may overlap a channel area. The second electrode D6 may be electrically connected to a connecting electrode 125 via a contact hole 47. The connecting electrode 125 may be electrically connected to the first electrode of the OLED via a via hole. The gate electrode G6 may be formed based on a portion of the emission control line ELn. The sixth transistor T6 of the first pixel PX1 may be located at the right side, and the sixth transistor T6 of the second pixel PX2 may be located at the left side.

The seventh transistor T7 may include the gate electrode G7, the first electrode S7, and the second electrode D7. The first electrode S7 may correspond to a source area doped with impurities in the semiconductor layer, and the second electrode D7 may correspond to a drain area doped with impurities in the semiconductor layer. The gate electrode G7 may overlap a channel area. The first electrode S7 may be connected to the second electrode D6 of the sixth transistor T6. Also, the first electrode S7 may be electrically connected to the first electrode of the OLED. The second electrode D7 may be connected to the initialization voltage line VLn+1 in a next row (e.g., an even row), via a contact hole 48. The seventh transistor T7 of the first pixel PX1 may be located at the right side, and the seventh transistor T7 of the second pixel PX2 may be located at the left side.

The connecting electrode 121 connected to the contact hole 41 may connect the first electrode Cst1 of the capacitor Cst of the first pixel PX1 to the second electrode D3 of the third transistor T3 and the second electrode D4 of the fourth transistor T4. The first electrode Cst1 of the capacitor Cst may also function as the gate electrode G1 of the first transistor T1. The second electrode Cst2 of the capacitor Cst may be connected to the driving voltage line PL via contact holes 49 and 50, and receive the first power voltage ELVDD from the driving voltage line PL.

The first electrode Cst1 of the capacitor Cst may be spaced apart from an adjacent pixel, have a quadrilateral shape, and may be formed on the same level with the same material as the first scan line GILn, the second scan line GWLn, the emission control line ELn, and the gate electrodes G1 to G7 of the first to seventh transistors T1 to T7.

The second electrode Cst2 of the capacitor Cst may be connected to the second electrodes Cst2 of pixels adjacently arranged in the second direction, e.g., to the second electrodes Cst2 of the pixels in the same row. The second electrode Cst2 of the capacitor Cst may overlap the first electrode Cst1 such that the first electrode Cst1 is completely covered, and may vertically overlap the first transistor T1. In order to create an area for the capacitor Cst which is reduced due to the curved semiconductor layer of the first transistor T1, the capacitor Cst may overlap the semiconductor layer of the first transistor T1, and thus capacitance may be generated even under a high resolution state.

The first data line DL1 may be arranged in the first direction on the left side of the first and second pixels PX1 and PX2. The second data line DL2 may be arranged in the first direction on the right side of the first and second pixels PX1 and PX2. The first data line DL1 may be connected to the second transistor T2 of the first pixel PX1, and the second data line DL2 may be connected to the second transistor T2 of the second pixel PX2. The first data line DL1 and the second data line DL2 may be formed on the same level with the same material as the driving voltage line PL.

The first data line DL1 may be located between the semiconductor layer in the first direction and the capacitor Cst on the left side, and may not overlap the semiconductor layer in the first direction. The second data line DL2 may be located between the semiconductor layer in the first direction and the capacitor Cst on the right side, and may not overlap the semiconductor layer in the first direction.

The driving voltage line PL may extend in the first direction between the first and second data lines DL1 and DL2 of the first pixel PX1, and may be located near the first data line DL1. The driving voltage line PL may extend in the first direction between the first and second data lines DL1 and DL2 of the second pixel PX2, and may be located near the second data line DL2.

The second electrodes Cst2 of the capacitors Cst may be connected to one another among pixels on the same row that are nearby one another in the second direction, and electrically connected to the driving voltage line PL. Accordingly, the driving voltage line PL may function as a driving voltage line in the first direction, and the second electrode Cst2 of the capacitor Cst may function as a driving voltage line in the second direction, and the driving voltage line PL may have a mesh structure in overall. Also, the driving voltage line PL may be electrically connected to the fifth transistor T5.

The initialization voltage line VLn may extend in the second direction and located near the first scan line GILn. The initialization voltage line VLn may be electrically connected to the first electrode S4 of the fourth transistor T4 via the contact hole 44. The initialization voltage line VLn may be formed on the same level with the same material as the second electrode Cst2 of the capacitor Cst. In another embodiment, the initialization voltage line VLn may be formed on the same level as the first electrode (not shown) of the OLED on the insulating layer on the first and second data lines DL1 and DL2 using contact metal electrically connected to the first electrode S4 of the fourth transistor T4.

The display device according to an embodiment may include the shield line SHL at an outer side of one of the first and second data lines DL1 and DL2, and the shield line SHL may be electrically connected to a voltage line that applies a constant voltage. In an embodiment, the shield line SHL may be located between the second data line DL2 and a first data line DL1 of a pixel that is to the right of the first and second data lines DL1 and DL2 and located in the same row.

Since the demultiplexing technique is used to drive driving the display device, the first and second data lines DL1 and DL2 may be arranged on the same layer, nearby and parallel to one another. Therefore, when voltage of one of the first and second data lines DL1 and DL2 changes while the other is floating, signal coupling may occur between the first and second data lines DL1 and DL2, and thus the floating data line may have an undesired voltage. This may be shown as a linear defect in an image, and thus cause a decrease in display quality.

According to an embodiment, a constant voltage line, e.g., the shield line SHL that is a direct current (DC) line, may be provided between two data lines of left and right adjacent pixels, and thus, signal coupling may be prevented between the data lines of the adjacent pixels and the display quality may be improved.

Figure 6:
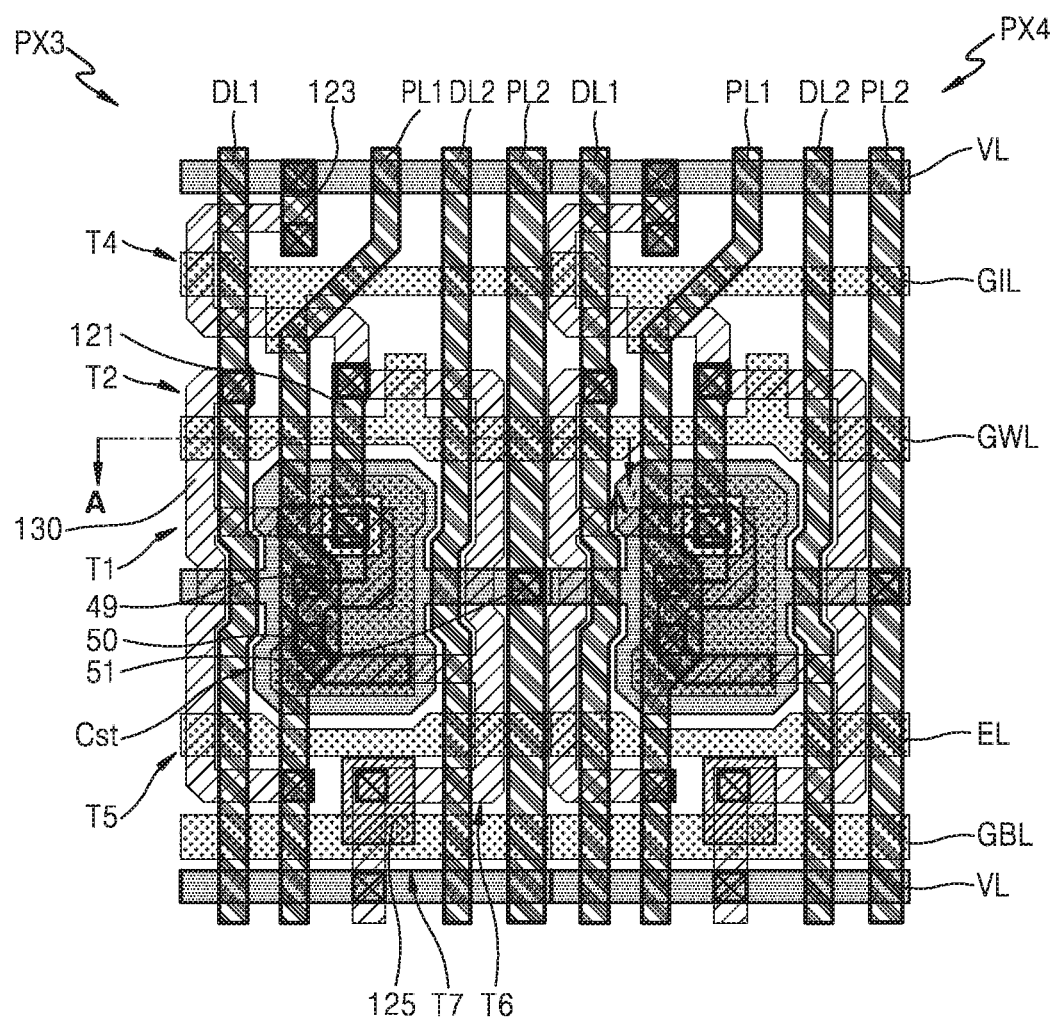
FIG. 6 is a plan view of pixels in which a shield line is a driving voltage line, according to an embodiment.
Figure 7:
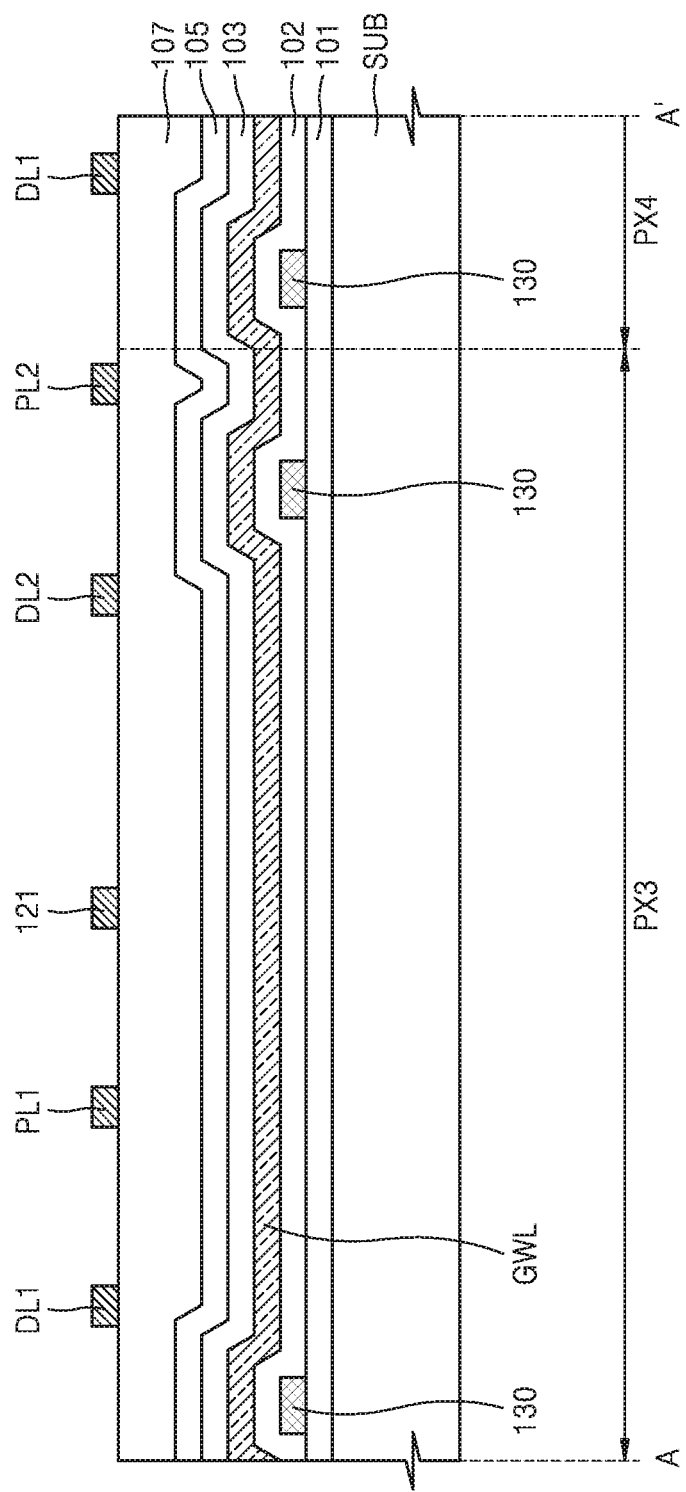
FIG. 7 is a cross-sectional view of the pixels cut along the line A-A' of FIG. 6.

FIG. 6 is a plan view of pixels in which a shield line is a driving voltage line, according to an embodiment. FIG. 7 is a cross-sectional view of the pixels cut along the line A-A' of FIG. 6.

FIG. 6 shows a third pixel PX3 and a fourth pixel PX4 arranged in adjacent columns on an arbitrary row on a substrate SUB. FIG. 6 does not illustrate the OLED but only illustrates a pixel circuit. The third pixel PX3 and the fourth pixel PX4 are configured in substantially the same manner as the first pixel PX1 of FIG. 5, and thus, identical features will not be repeatedly described below.

Each of the third and fourth pixels PX3 and PX4 may include the initialization voltage line VL applying the initialization voltage Vint, the first scan line GIL applying the first scan signal GIn, the second scan line GWL applying the second scan signal GWn, an emission control line EL applying the emission control signal En, and the third scan line GBL applying the third scan signal GBn. The initialization voltage line VL, the first scan line GIL, the second scan line GWL, the emission control line EL, and the third scan line GBL may be parallel to one another in the second direction. The first data line DL1 at a left side, the second data line DL2 at a right side, a first driving voltage line PL1, and a second driving voltage line PL2 may be spaced apart by a predetermined distance and parallel to one another in the first direction. The third and fourth pixels PX3 and PX4 may be connected to the first data line DL1.

A buffer layer 101 may be provided on the substrate SUB, and a semiconductor layer 130 of each of the first to seventh transistors T1 to T7 may be provided on the buffer layer 101. The semiconductor layer 130 may have various curved shapes. The semiconductor layer 130 may be formed by using, for example, polysilicon, and may include a channel area that is not doped with impurities, and source and drain areas that are formed at two sides of the channel area by doping with impurities. The impurity may vary according to a type of the transistor. For example, the impurity may include an n-type impurity or a p-type impurity.

A first insulating layer 103 may be provided on the semiconductor layer 130. The first insulating layer 103 may function as a gate insulating layer. The first insulating layer 103 may be formed as a single inorganic insulating layer or a plurality of inorganic insulating layers.

Lines, e.g., the first scan line GIL, the second scan line GWL, the third scan line GBL, the emission control line EL, the gate electrodes G1 to G7 of the first to seventh transistors T1 to T7, and the first electrode Cst1 of the capacitor Cst may be provided on the first insulating layer 103. The second scan line GWL is shown in FIG. 7.

A second insulating layer 105 may be provided on the lines. The second insulating layer 105 may be formed as a single inorganic insulating layer or a plurality of inorganic insulating layers.

The second electrode Cst2 of the capacitor Cst and the initialization voltage line VL are provided on the second insulating layer 105.

A third insulating layer 107 may be provided on the second electrode Cst2 of the capacitor Cst and the initialization voltage line VL. The third insulating layer 107 may be formed as a single organic insulating layer or a plurality of organic insulating layers.

The first data line DL1, the second data line DL2, the first driving voltage line PL1, the second driving voltage line PL2, and the connecting electrodes 121, 123, and 125 may be provided on the third insulating layer 107. FIG. 7 shows the first data line DL1, the second data line DL2, the first driving voltage line PL1, the second driving voltage line PL2, and the connecting electrode 121.

In another embodiment, the initialization voltage line VL is not formed with the second electrode Cst2 of the capacitor Cst. For example, although FIG. 7 does not show, a fourth insulating layer may be provided on the first data line DL1, the second data line DL2, the first driving voltage line PL1, the second driving voltage line PL2, and the connecting electrodes 121, 123, and 125. The first electrode of the OLED may be formed on the fourth insulating layer. And the initialization voltage line VL may be formed on the fourth insulating layer with the first electrode of the OLED.

The first data line DL1 is provided in the first direction on the left side of the third and fourth pixels PX3 and PX4. The second data line DL2 is provided in the first direction on the right side of the third and fourth pixels PX3 and PX4. The first data line DL1 may be connected to the second transistor T2 of the third and fourth pixels PX3 and PX4.

The first data line DL1 may be located between the semiconductor layer 130 in the first direction and the capacitor Cst on the left side, and may not overlap the semiconductor layer 130. The second data line DL2 may be located between the semiconductor layer 130 in the first direction and the capacitor Cst on the right side, and may not overlap the semiconductor layer 130. Since the first and second data lines DL1 and DL2 do not overlap the semiconductor layer 130, parasitic capacitance may be prevented between the first and second data lines DL1 and DL2 and the semiconductor layer 130.

The first driving voltage line PL1 may extend between the first and second data lines DL1 and DL2 in the third and fourth pixels PX3 and PX4, e.g., in the first direction between the first data line DL1 and the connecting electrode 121.

The second driving voltage line PL2 may extend in the first direction between the second data line DL2 of the third pixel PX3 and the first data line DL1 of the fourth pixel PX4. The second driving voltage line PL2 may function as the shield line SHL that blocks signal coupling between the second data line DL2 of the third pixel PX3 and the first data line DL1 of the fourth pixel PX4. The first and second driving voltage lines PL1 and PL2 may transmit substantially the same DC voltage, e.g., the first power voltage ELVDD, to a pixel.

Through the contact holes 49 and 50, the first driving voltage line PL1 may be electrically connected to the second electrodes Cst2 of the capacitors Cst that are connected to each other among pixels that are adjacently provided on the same row in the second direction. Through a contact hole 51, the second driving voltage line PL2 may be electrically connected to the second electrodes Cst2 of the capacitors Cst that are connected to each other among pixels that are adjacently provided on the same row in the second direction. Accordingly, the first driving voltage line PL1 and the second driving voltage line PL2 may function as a driving voltage line in the first direction, and the second electrode Cst2 of the capacitor Cst may function as a driving voltage line in the second direction, thus providing a mesh structure driving voltage line.

According to an embodiment, the driving voltage line is separated as the first driving voltage line PL1 and the second driving voltage line PL2, and the second driving voltage line PL2 is provided between adjacent data lines of pixels that are adjacently provided in the row direction. Accordingly, since a mesh structure may be formed and an overall width of a driving voltage line in a pixel may be increased, a drop of the first power voltage ELVDD may be reduced and signal coupling between the data lines of the adjacent pixels may be prevented.

Figure 8:
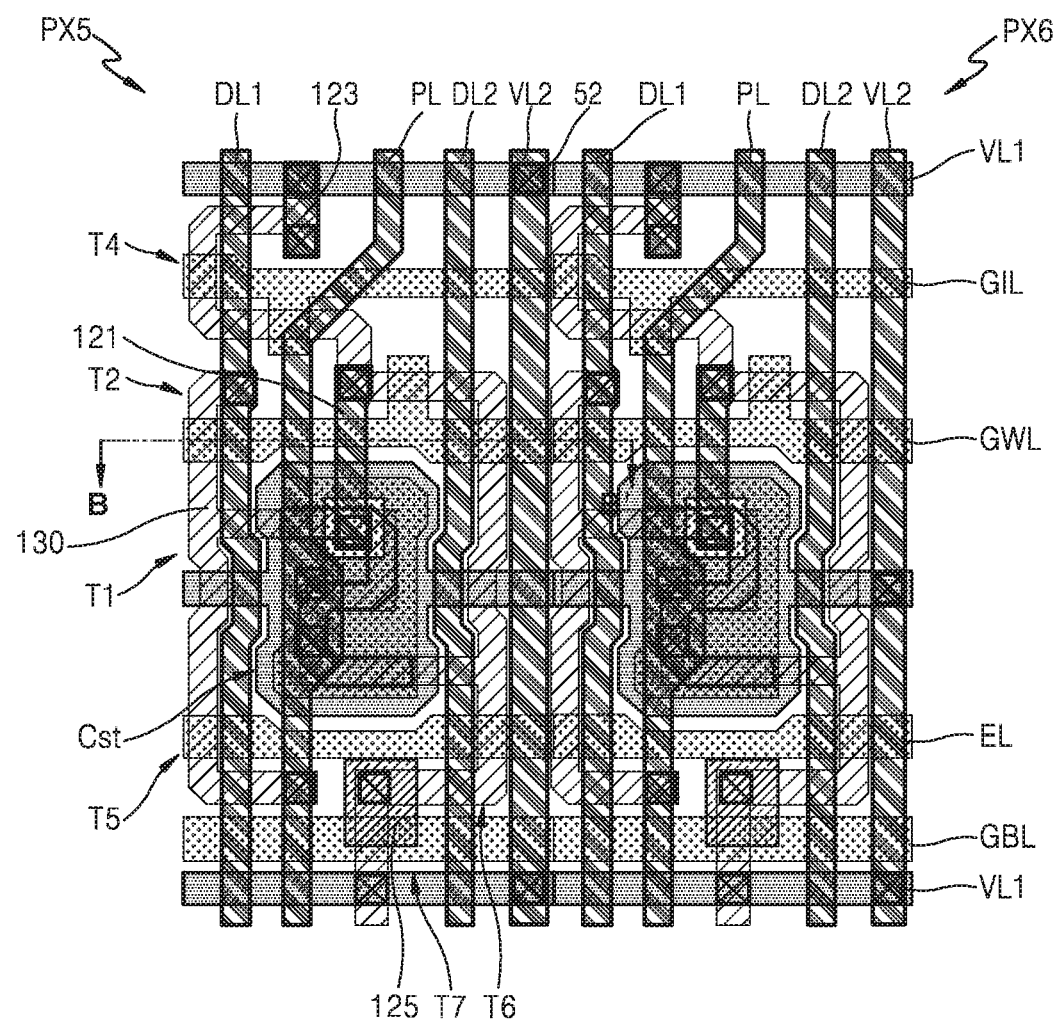
FIG. 8 is a plan view of pixels in which a shield line is an initialization voltage line, according to an embodiment.
Figure 9:
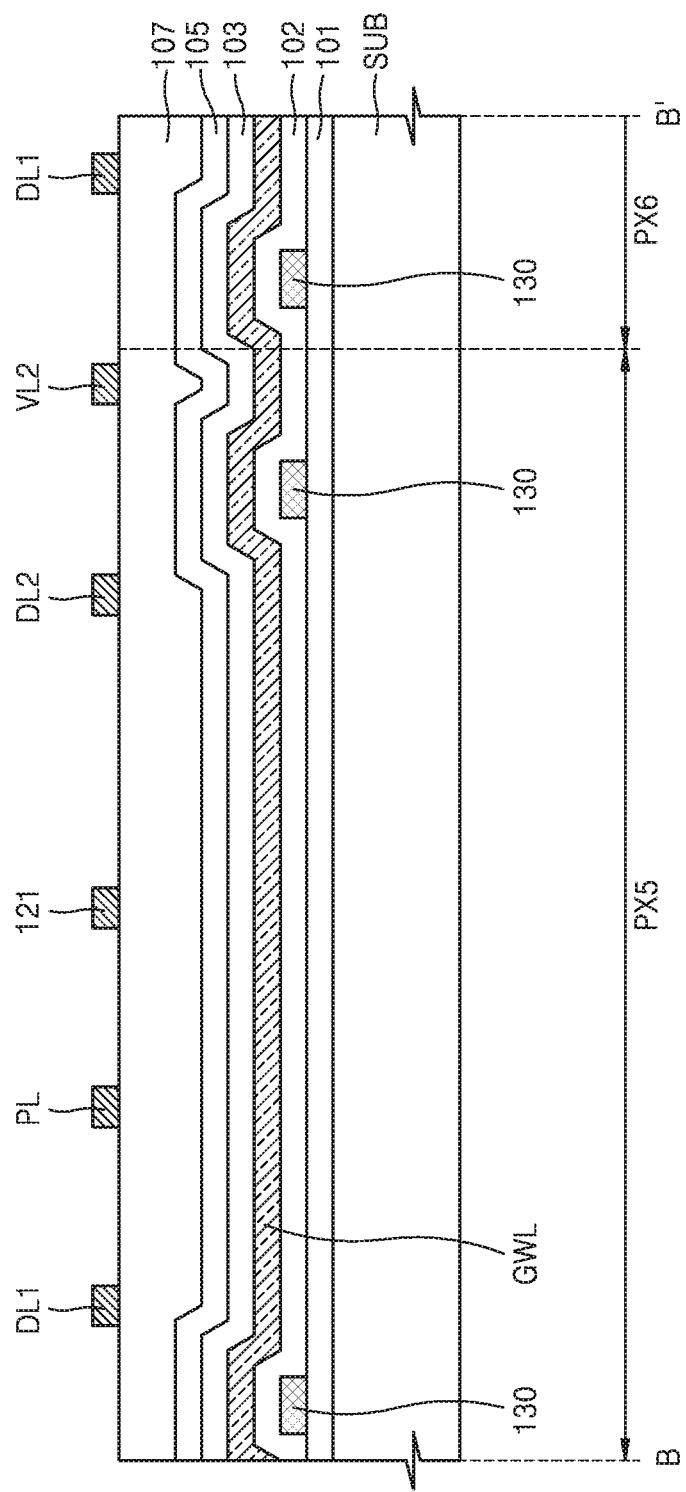
FIG. 9 is a cross-sectional view of the pixels cut along the line B-B' of FIG. 8.

FIG. 8 is a plan view of pixels in which a shield line is an initialization voltage line, according to an embodiment. FIG. 9 is a cross-sectional view of the pixels cut along the line B-B' of FIG. 8.

FIG. 8 shows a fifth pixel PX5 and a sixth pixel PX6 arranged in adjacent columns on an arbitrary row on the substrate SUB. FIG. 8 does not illustrate the OLED but only illustrates a pixel circuit. The fifth pixel PX5 and the sixth pixel PX6 are configured in substantially the same manner as the first pixel PX1 of FIG. 5, and thus, identical features will not be repeatedly described below.

Each of the fifth and sixth pixels PX5 and PX6 may include a first initialization voltage line VL1 applying the initialization voltage Vint, the first scan line GIL applying the first scan signal GIn, the second scan line GWL applying the second scan signal GW, the emission control line EL applying the emission control signal En, and the third scan line GBL applying the third scan signal GBn. The first initialization voltage line VL1, the first scan line GIL, the second scan line GWL, the emission control line EL, and the third scan line GBL may be parallel to one another in the second direction. The first data line DL1 at a left side, the second data line DL2 at a right side, the driving voltage line PL, and a second initialization voltage line VL2 may be spaced apart by a predetermined distance and parallel to one another in the first direction. The fifth and sixth pixels PX5 and PX6 may be connected to the first data line DL1.

The buffer layer 101 may be provided on the substrate SUB, and the semiconductor layer 130 of the first to seventh transistors T1 to T7 may be provided on the buffer layer 101. The semiconductor layer 130 may have various curved shapes.

The first insulating layer 103 may be provided on the semiconductor layer 130.

Lines, e.g., the first scan line GIL, the second scan line GWL, the third scan line GBL, the emission control line EL, the gate electrodes G1 to G7 of the first to seventh transistors T1 to T7, and the first electrode Cst1 of the capacitor Cst may be provided on the first insulating layer 103. The second scan line GWL is shown in FIG. 9.

The second insulating layer 105 may be provided on the lines.

The second electrode Cst2 of the capacitor Cst and the first initialization voltage line VL1 are provided on the second insulating layer 105.

The third insulating layer 107 may be provided on the second electrode Cst2 of the capacitor Cst and the first initialization voltage line VL1.

The first data line DL1, the second data line DL2, the driving voltage line PL, the second initialization voltage line VL2, and the connecting electrodes 121, 123, and 125 may be provided on the third insulating layer 107. FIG. 9 shows the first data line DL1, the second data line DL2, the driving voltage line PL, the connecting electrode 121, and the second initialization voltage line VL2.

In another embodiment, the first initialization voltage line VL1 is not formed with the second electrode Cst2 of the capacitor Cst. For example, although FIG. 9 does not show, a fourth insulating layer may be provided on the first data line DL1, the second data line DL2, the driving voltage line PL, the second initialization voltage line VL2, and the connecting electrodes 121, 123, and 125. The first electrode of the OLED may be formed on the fourth insulating layer. And the first initialization voltage line VL1 may be formed on the fourth insulating layer with the first electrode of the OLED.

The first data line DL1 is provided in the first direction on the left side of the fifth and sixth pixels PX5 and PX6. The second data line DL2 may be provided in the first direction on the right side of the fifth and sixth pixels PX5 and PX6. The first data line DL1 may be connected to the second transistor T2 of the fifth and sixth pixels PX5 and PX6.

The first data line DL1 may be located between the semiconductor layer 130 in the first direction and the capacitor Cst on the left side, and may not overlap the semiconductor layer 130. The second data line DL2 may be located between the semiconductor layer 130 in the first direction and the capacitor Cst on the right side, and may not overlap the semiconductor layer 130. Since the first and second data lines DL1 and DL2 do not overlap the semiconductor layer 130, parasitic capacitance may be prevented between the first and second data lines DL1 and DL2 and the semiconductor layer 130.

The driving voltage line PL may extend between the first and second data lines DL1 and DL2 in the fifth and sixth pixels PX5 and PX6, e.g., in the first direction between the first data line DL1 and the connecting electrode 121.

The second initialization voltage line VL2 may extend in the first direction between the second data line DL2 of the third pixel PX3 and the first data line DL1 of the fourth pixel PX4. The second initialization voltage line VL2 may function as the shield line SHL that blocks signal coupling between the second data line DL2 of the third pixel PX3 and the first data line DL1 of the fourth pixel PX4. The first and second initialization voltage lines VL1 and VL2 may transmit substantially the same DC voltage, e.g., the initialization voltage Vint, to a pixel. The second initialization voltage line VL2 may be electrically connected to the first initialization voltage line VL1 via a contact hole 52. Therefore, the first initialization voltage line VL1 in the second direction and the second initialization voltage line VL2 in the first direction may have a mesh structure in overall.

According to an embodiment, in addition to the first initialization voltage line VL1 in the second direction, the second initialization voltage line VL2 in the first direction is provided between adjacent data lines of pixels adjacent in the row direction. Accordingly, the initialization voltage line may have a mesh structure, a drop of the initialization voltage Vint may be reduced, and signal coupling between the data lines of the adjacent pixels may be prevented.

Figure 10:
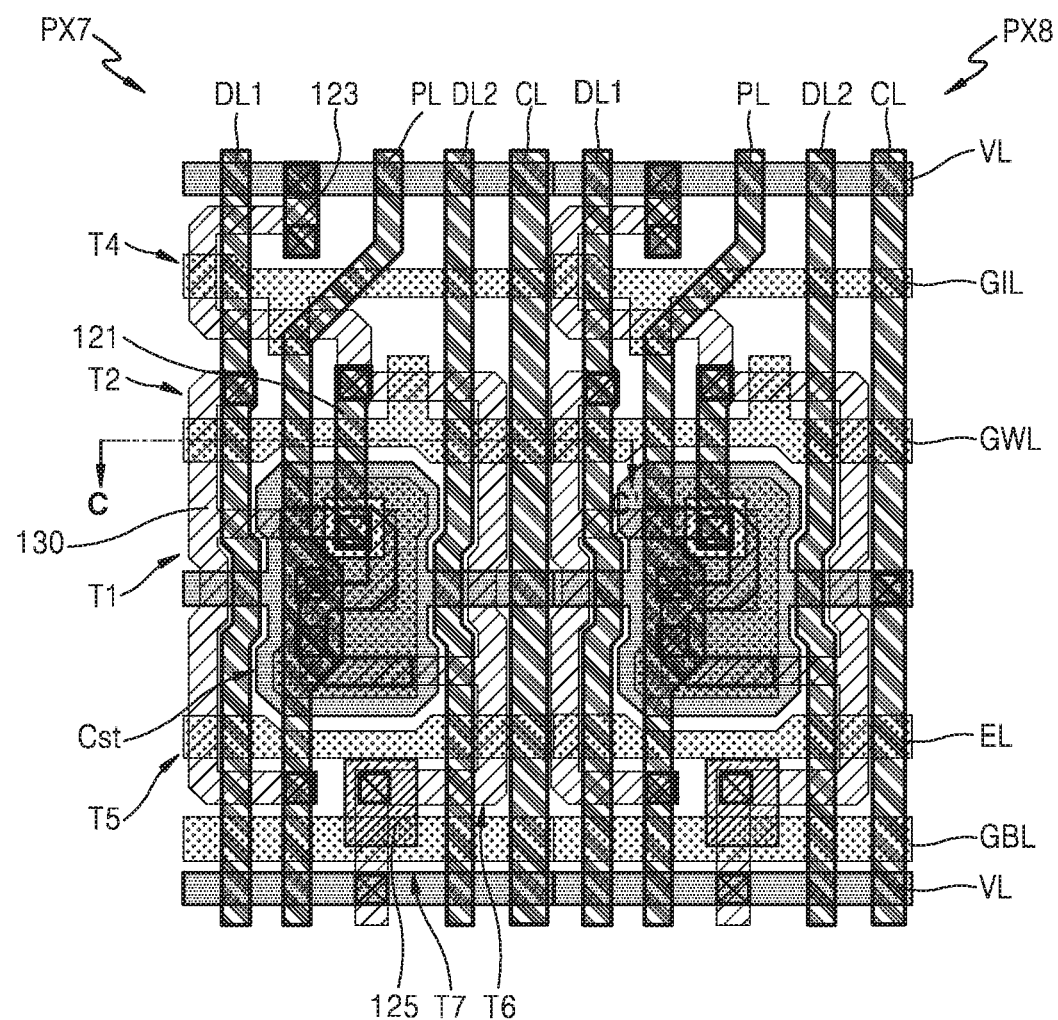
FIG. 10 is a plan view of pixels in which a shield line is a second power voltage line, according to an embodiment.
Figure 11:
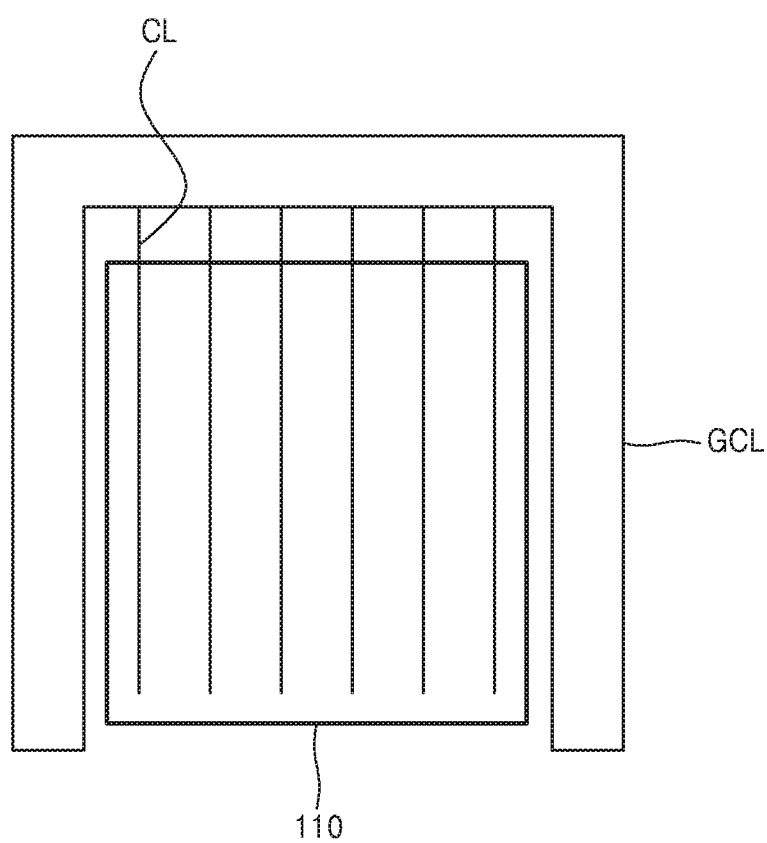
FIG. 11 is a plan view for describing an arrangement of a second power voltage line.
Figure 12:
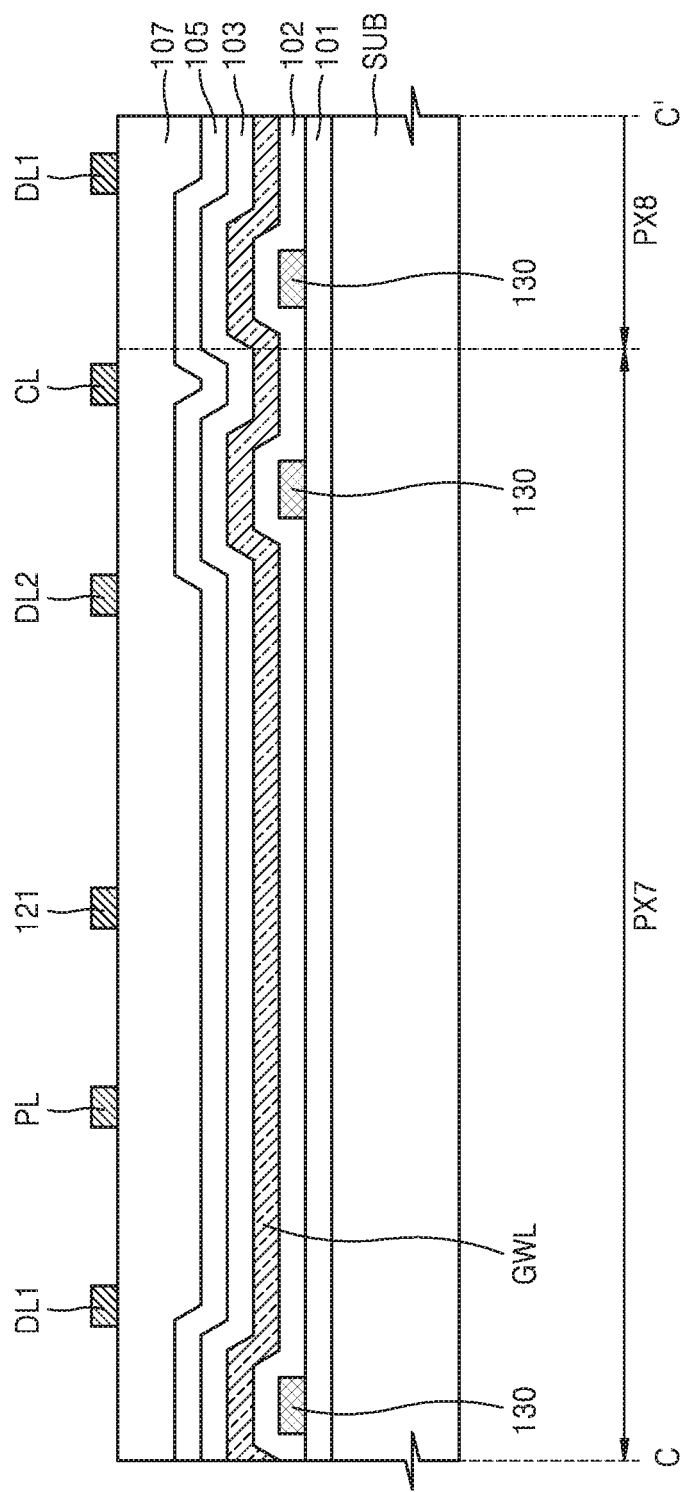
FIG. 12 is a cross-sectional view of the pixels cut along the line C-C' of FIG. 10.

FIG. 10 is a plan view of pixels in which a shield line is a second power voltage line, according to an embodiment. FIG. 11 is a plan view for describing an arrangement of a second power voltage line. FIG. 12 is a cross-sectional view of the pixels cut along the line C-C' of FIG. 10.

FIG. 10 shows a seventh pixel PX7 and an eighth pixel PX8 arranged in adjacent columns on an arbitrary row on the substrate SUB. FIG. 10 dose not illustrate the OLED but only illustrates a pixel circuit. The seventh and eighth pixels PX7 and PX8 are configured in substantially the same manner as the first pixel PX1 of FIG. 5, and thus, identical features will not be repeatedly described below. Also, features and components described above with reference to FIGS. 5 and 6 will not be repeatedly described below.

Each of the seventh and eighth pixels PX7 and PX8 may include the initialization voltage line VL applying the initialization voltage Vint, the first scan line GIL applying the first scan signal GI, the second scan line GWL applying the second scan signal GW, the emission control line EL applying the emission control signal E, and the third scan line GBL applying the third scan signal GB. The initialization voltage line VL, the first scan line GIL, the second scan line GWL, the emission control line EL, and the third scan line GBL may be parallel to one another in the second direction. The first data line DL1 at the left side, the second data line DL2 at the right side, the driving voltage line PL, and a second power voltage line CL may be spaced apart by a predetermined distance and parallel to one another in the first direction. The seventh and eighth pixels PX7 and PX8 may be connected to the first data line DL1.

The buffer layer 101 may be provided on the substrate SUB, and the semiconductor layer 130 of each of the first to seventh transistors T1 to T7 may be provided on the buffer layer 101. The semiconductor layer 130 may have various curved shapes.

The first insulating layer 103 may be provided on the semiconductor layer 130.

Lines, e.g., the first scan line GIL, the second scan line GWL, the third scan line GBL, the emission control line EL, the gate electrodes G1 to G7 of the first to seventh transistors T1 to T7, and the first electrode Cst1 of the capacitor Cst may be provided on the first insulating layer 103. The second scan line GWL is shown in FIG. 11.

The second insulating layer 105 may be provided on the lines.

The second electrode Cst2 of the capacitor Cst and the initialization voltage line VL are provided on the second insulating layer 105.

The third insulating layer 107 may be provided on the second electrode Cst2 of the capacitor Cst and the initialization voltage line VL.

The first data line DL1, the second data line DL2, the driving voltage line PL, the second power voltage line CL, and the connecting electrodes 121, 123, and 125 may be provided on the third insulating layer 107. FIG. 11 shows the first data line DL1, the second data line DL2, the driving voltage line PL, the connecting electrode 121, and the second power voltage line CL.

In another embodiment, the initialization voltage line VL is not formed with the second electrode Cst2 of the capacitor Cst. For example, although FIG. 9 does not show, a fourth insulating layer may be provided on the first data line DL1, the second data line DL2, the driving voltage line PL, the second power voltage line CL, and the connecting electrodes 121, 123, and 125. The first electrode of the OLED may be formed on the fourth insulating layer. And the initialization voltage line VL may be formed on the fourth insulating layer with the first electrode of the OLED.

The first data line DL1 is provided in the first direction on the left side of the seventh and eighth pixels PX7 and PX8. The second data line DL2 may be provided in the first direction on the right side of the seventh and eighth pixels PX7 and PX8. The first data line DL1 may be connected to the second transistor T2 of the seventh and eighth pixels PX7 and PX8.

The first data line DL1 may be located between the semiconductor layer 130 in the first direction and the capacitor Cst on the left side, and may not overlap the semiconductor layer 130. The second data line DL2 may be located between the semiconductor layer 130 in the first direction and the capacitor Cst on the right side, and may not overlap the semiconductor layer 130. Since the first and second data lines DL1 and DL2 do not overlap the semiconductor layer 130, parasitic capacitance may be prevented between the first and second data lines DL1 and DL2 and the semiconductor layer 130.

The driving voltage line PL may extend between the first and second data lines DL1 and DL2 in the seventh and eighth pixels PX7 and PX8, e.g., in the first direction between the first data line DL1 and the connecting electrode 121.

The second power voltage line CL may extend in the first direction between the second data line DL2 of the seventh pixel PX7 and the first data line DL1 of the eighth pixel PX8. The second power voltage line CL may function as the shield line SHL that blocks signal coupling between the second data line DL2 of the seventh pixel PX7 and the first data line DL1 of the eighth pixel PX8. As shown in FIG. 11, the second power voltage line CL may extend in the first direction of the pixel unit 110, from a global power voltage line GCL that is arranged along at least one, e.g., three sides, from among four sides that form a boundary of the substrate SUB in a non-display area around the pixel unit 110. The second electrode of the OLED, which is provided entirely on the pixel unit 110 as a common electrode, may be electrically connected to the global power voltage line GCL. Accordingly, the second power voltage line CL may be electrically connected to the second electrode of the OLED, and transmit the DC voltage, e.g., the second power voltage ELVSS, to a pixel.

According to an embodiment, the second power voltage line CL is provided between adjacent data lines of adjacent pixels. Therefore, when the second power voltage ELVSS is transmitted to the pixel with the second electrode of the OLED and the second power voltage line CL a drop of the second power voltage ELVSS may be reduced, and signal coupling between the data lines of the adjacent pixels may be prevented.

Figure 13:
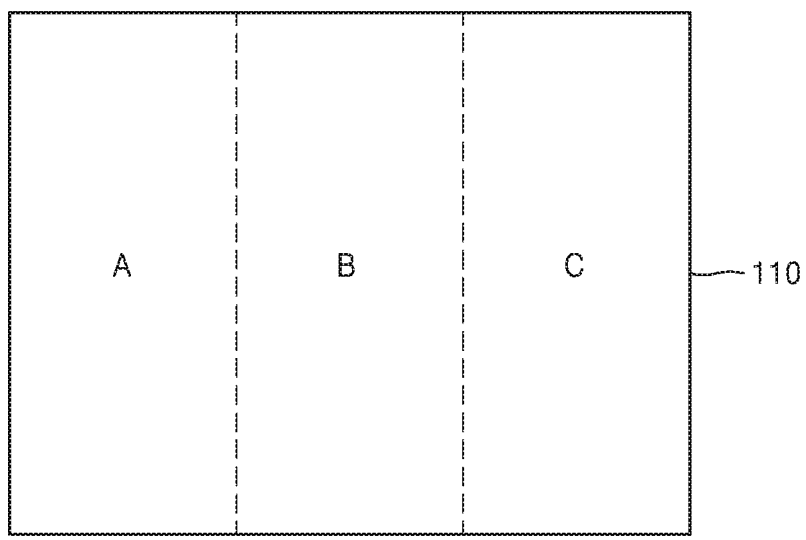
FIG. 13 is a diagram for describing a pixel arrangement of a display device, according to an embodiment.

FIG. 13 is a diagram for describing a pixel arrangement of the display device 100, according to an embodiment.

Referring to FIG. 13, the display device 100 applies different constant voltages to a shield line SHL in a pixel for areas of the pixel unit 110.

The central area B may have relatively low long range uniformity (LRU). A shield line SHL of a pixel located in a central area B of the pixel unit 110 may be the second driving voltage line PL2 that is electrically connected to the first driving voltage line PL1 as shown in FIG. 6, and the first power voltage ELVDD may be applied to the shield line SHL. Alternatively, the shield line SHL of the pixel located in the central area B of the pixel unit 110 may be the second initialization voltage line VL2 that is electrically connected to the first initialization voltage line VL1 as shown in FIG. 8, and the initialization voltage Vint may be applied to the shield line SHL. Shield lines SHL of a pixel located in a left area A and a right area C of the pixel unit 110 may be the second power voltage line CL that is electrically connected to the global power voltage line GCL as shown in FIG. 10, and the second power voltage ELVSS may be applied to the shield line SHL.

Thus, in the display device 100 according to the embodiment, different constant voltages may be applied to a shield line SHL of a pixel, based on a pixel structure of the pixel unit 110 and/or respective LRU of areas of the pixel unit 110. Accordingly, display quality of the display device 100 may be improved.

According to at least one of the disclosed embodiments, a display device including pixels with two data lines may have improved display quality.

While the inventive technology has been described with reference to the figures, it will be understood by those of ordinary skill in the art that various changes in form and details may be made therein without departing from the spirit and scope as defined by the following claims.

What is claimed is:

1. A display device comprising:
   a first pixel in a first column and a first row, the first pixel including a plurality of first pixel transistors disposed along a first semiconductor layer;
   a second pixel in a second column adjacent to the first column and the first row, the second pixel including a plurality of second pixel transistors disposed along a second semiconductor layer;
   a first data line extending in a first direction in the first column;
   a second data line spaced apart from and parallel to the first data line in the first column;
   a third data line spaced apart from and parallel to the second data line, the third data line extending in the first direction in the second column;
   a fourth data line spaced apart from and parallel to the third data line in the second column;
   a first driving voltage line extending in the first direction between the first and second data lines in the first column; and
   a second driving voltage line extending in the first direction between the third and fourth data lines in the second column;
   a first shield line extending in the first direction and between the second and third data lines; and
   a second shield line extending in the first direction and outside of the fourth data line,
   wherein the first data line is between a first part of the first semiconductor layer extending in the first direction and the first driving voltage line, and a second part of the first semiconductor layer extending in the first direction is between the second data line and the first shield line, in a plan view,
   wherein the first data line, the first driving voltage line, the second data line and the first shield line are disposed on a same layer, and
   wherein the first driving voltage line is disposed between the first data line and the second data line and the second data line is between the first driving voltage line and the first shield line so that the first part of the first semiconductor layer in the first direction, the first data line, the first driving voltage line, the second data line, the second part of the first semiconductor layer in the first direction and the first shield line are spaced apart from each other as listed in a second direction crossing the first direction, in the first column.

2. The display device of claim 1, further comprising:
   a voltage line providing a substantially constant voltage,
   wherein the first shield line is electrically connected to the first voltage line.

3. The display device of claim 1,
   wherein the first shield line is electrically connected to the first driving voltage line.

4. The display device of claim 1, further comprising:
   an initialization voltage line intersecting the first and second data lines and extending in the second direction,
   wherein the first shield line is electrically connected to the initialization voltage line.

5. The display device of claim 4,
   wherein the first shield line is provided over or under the initialization voltage line.

6. The display device of claim 1, further comprising:
   a second voltage line providing a second power voltage different from a first power voltage provided to the first driving voltage line,
   wherein the first shield line is electrically connected to the second voltage line.

7. The display device of claim 1, further comprising:
   a third pixel in the first column and a second row adjacent to the first row, the third pixel including a plurality of third pixel transistors;
   a fourth pixel in the second column and the second row;
   wherein an arrangement of the plurality of third pixel transistors of the third pixel is opposite to an arrangement of the plurality of first pixel transistors of the first pixel, in the second direction, and
   wherein an arrangement of the plurality of second pixel transistors of the second pixel is the same as the arrangement of the plurality of first pixel transistors of the first pixel, in the second direction.

8. The display device of claim 7,
   wherein the first pixel is connected to the first data line, the second pixel is connected to the third data line, the third pixel is connected to the second data line, and the fourth pixel is connected to the fourth data line, and
   wherein the first driving voltage line is connected to the first pixel and the third pixel in the first column, and the second driving voltage line is connected to the second pixel and the fourth pixel in the second column.

9. The display device of claim 1, further comprising
   a first capacitor between the first data line and the second data line and comprising a first lower electrode and a first upper electrode; and
   a second capacitor between the third data line and the fourth data line and comprising a second lower electrode and a second upper electrode,
   wherein the first driving voltage line is connected to the first upper electrode of the first capacitor, and the second driving voltage line is connected to the second upper electrode of the second capacitor.

10. The display device of claim 9, wherein the first upper electrode of the first capacitor is connected to the second upper electrode of the second capacitor and the first shield line.

11. A display device comprising:
    a pixel unit including a matrix of pixels,
    wherein the pixel unit includes a plurality of pixel areas, and
    wherein each of the pixel areas comprises:
    a first pixel in a first column and a first row;
    a second pixel in a second column adjacent to the first column and the first row;
    a third pixel in the first column and a second row adjacent to the first row;
    a first data line extending in a first direction in the first column and connected to the first pixel;
    a second data line spaced apart from and parallel to the first data line in the first column and connected to the third pixel;
    a third data line spaced apart from and parallel to the second data line, the third data line extending in the first direction in the second column;
    a fourth data line spaced apart from and parallel to the third data line in the second column;
    a first driving voltage line extending in the first direction between the first and second data lines in the first column;

a second driving voltage line extending in the first direction between the third and fourth data lines in the second column;

a first shield line extending in the first direction and between the second and third data lines; and a second shield line extending in the first direction and outside of the fourth data line, wherein a first power voltage is supplied to the first driving voltage line and the second driving voltage line of each of the pixel areas, and wherein a first constant voltage is supplied to the first shield line and the second shield line of at least one of the pixel areas, and a second constant voltage different from the first constant voltage is supplied to the first shield line and the second shield line of the others of the pixel areas, and wherein the first driving voltage line is disposed between the first data line and the second data line and the second data line is between the first driving voltage line and the first shield line so that the first data line, the first driving voltage line, the second data line and the first shield line are spaced apart from each other as listed in a second direction different from the first direction, in the first column.

12. The display device of claim 11, wherein the first pixel comprises a first driving transistor connected to first driving voltage line and a first electrode of a first light-emitting element, and the second pixel comprises a second driving transistor connected to second driving voltage line and a first electrode of a second light-emitting element, and wherein the first constant voltage is the first power voltage, and the second constant voltage is a second power voltage supplied to each of second electrodes of the first and second light-emitting elements, the second electrode of the second light-emitting element facing the first electrode.

13. The display device of claim 11, further comprising:

an initialization voltage line intersecting the first and second data lines and extending in the second direction, in each of the pixel areas, wherein the first pixel comprises a first driving transistor connected to first driving voltage line and a first electrode of a first light-emitting element, and the second pixel comprises a second driving transistor connected to second driving voltage line and a first electrode of a second light-emitting element, and wherein the first constant voltage is a voltage supplied to the initialization voltage line, and the second constant voltage is a second power voltage supplied to each of second electrodes of the first and second light-emitting elements, the second electrode of the first light-emitting element facing the first electrode.

* * * * *